United States Patent
Hirose et al.

(10) Patent No.: US 7,462,813 B2
(45) Date of Patent: Dec. 9, 2008

(54) SEMICONDUCTOR DEVICE AND METHOD WITH A LIGHT SHIELDED SECOND PHOTODIODE CONNECTED TO A VOLTAGE REGULATOR CIRCUIT

(75) Inventors: Atsushi Hirose, Atsugi (JP); Tatsuya Arao, Ebina (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 7 days.

(21) Appl. No.: 11/802,135

(22) Filed: May 21, 2007

(65) Prior Publication Data

US 2007/0278388 A1 Dec. 6, 2007

(30) Foreign Application Priority Data

May 30, 2006 (JP) ............................... 2006-150244

(51) Int. Cl.
*H01L 31/00* (2006.01)
(52) U.S. Cl. .................. 250/214.1; 250/214 DC; 250/214 C; 250/214 R
(58) Field of Classification Search ............. 250/208.1, 250/214.1, 214 R, 214 DC, 214 C, 214 A, 250/208.2, 214 AL; 257/347, 233, 235, 214; 327/512–515, 432

See application file for complete search history.

(56) References Cited

U.S. PATENT DOCUMENTS

| | | | |
|---|---|---|---|
| 4,659,930 A * | 4/1987 | Johnson et al. ........... 250/336.1 |
| 5,198,660 A | 3/1993 | Yokoyama et al. |
| 5,410,145 A * | 4/1995 | Coroy ..................... 250/214 C |
| 6,183,131 B1 | 2/2001 | Holloway et al. |
| 6,921,891 B2 * | 7/2005 | Seitz ....................... 250/214 R |
| 2003/0086476 A1 | 5/2003 | Mizuta |
| 2004/0095986 A1 | 5/2004 | Tsuchiya |

FOREIGN PATENT DOCUMENTS

| JP | 04-268816 | 9/1992 |
|---|---|---|
| JP | 05-215602 | 8/1993 |

* cited by examiner

*Primary Examiner*—Georgia Y. Epps
*Assistant Examiner*—Francis M Legasse, Jr.
(74) *Attorney, Agent, or Firm*—Eric J. Robinson; Robinson Intellectual Property Law Office, P.C.

(57) ABSTRACT

The semiconductor device includes a first photodiode, a second photodiode which is shielded from light, a first circuit group including a voltage follower circuit, a second circuit group, and a compensation circuit, in which an output from the first photodiode is inputted to the voltage follower circuit of the first circuit group, an output from the first circuit group is inputted to the compensation circuit, and an output from the second photodiode is inputted to the compensation circuit through the second circuit group. By adding or subtracting these inputs in the compensation circuit, an output fluctuation due to temperature of the first photodiode is removed. Note that a reference potential is supplied to the first photodiode so that an open circuit voltage is outputted, and a potential is supplied to the second photodiode so that a forward bias is applied to the second photodiode.

23 Claims, 16 Drawing Sheets

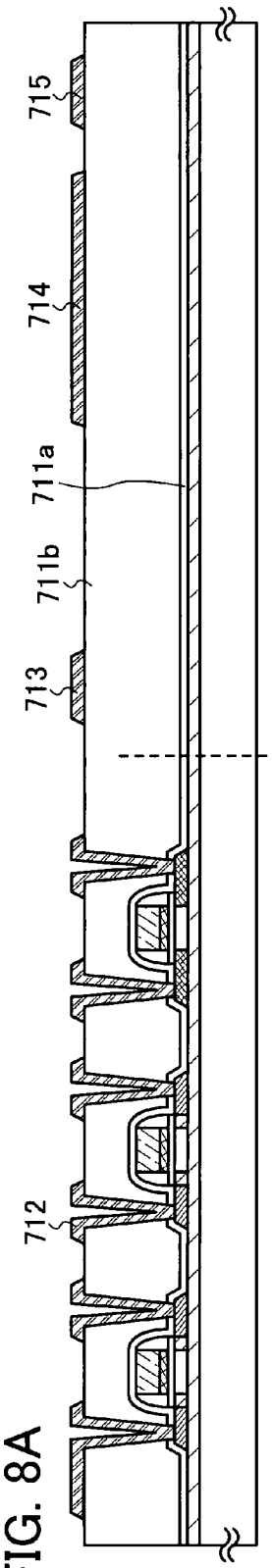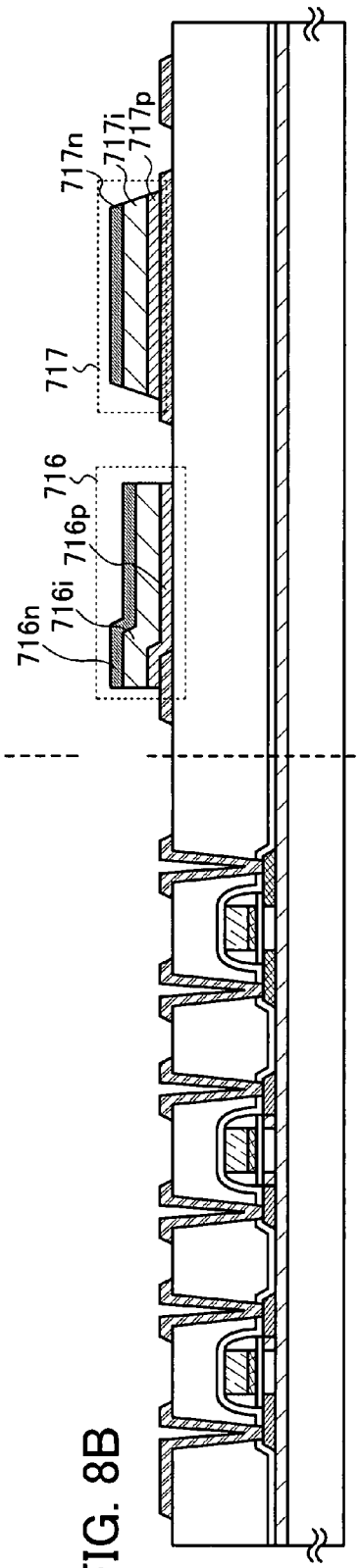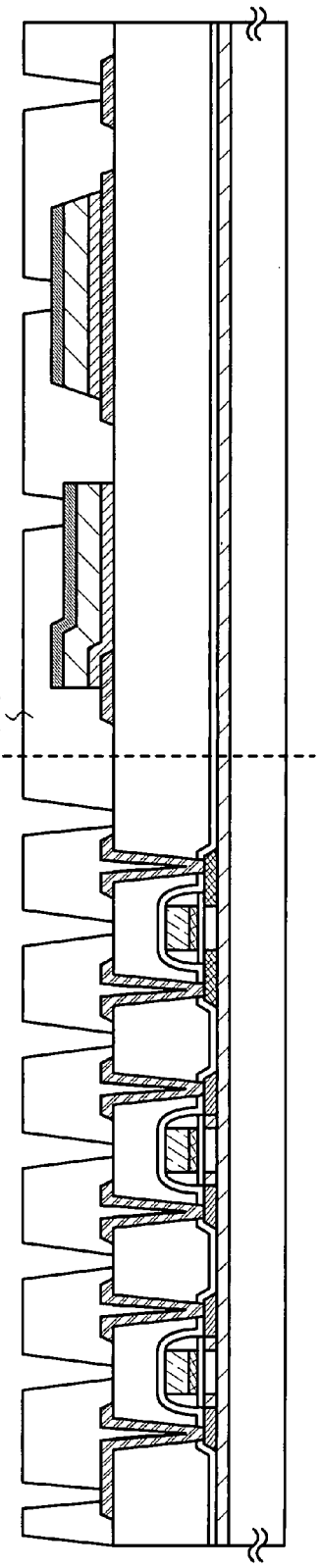

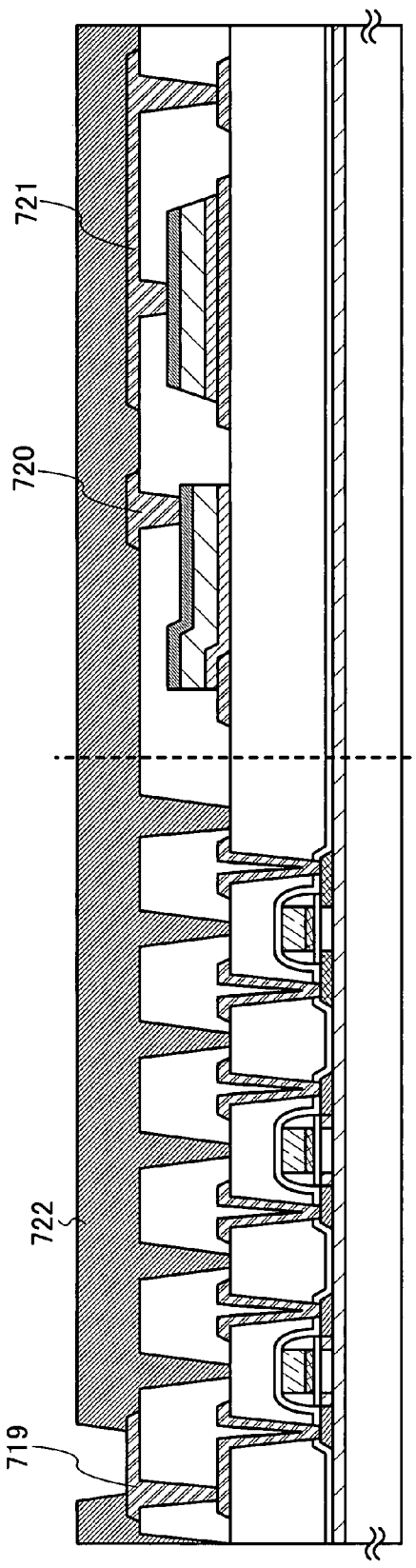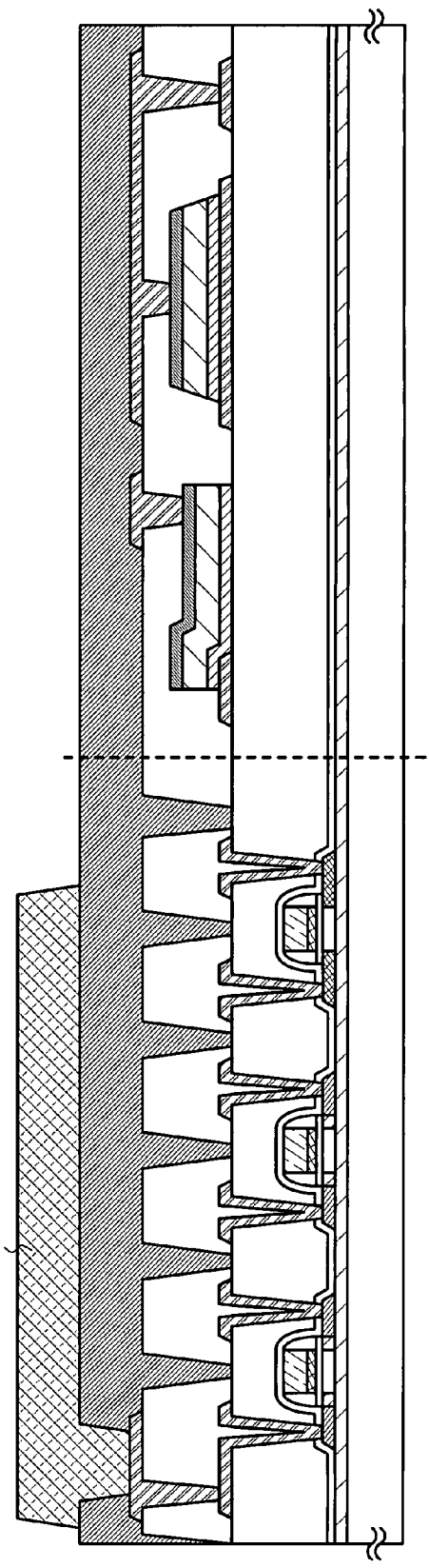

SEMICONDUCTOR DEVICE AND METHOD WITH A LIGHT SHIELDED SECOND PHOTODIODE CONNECTED TO A VOLTAGE REGULATOR CIRCUIT

BACKGROUND OF THE INVENTION

1. Field of the Invention

The present invention relates to a semiconductor device, particularly relates to a semiconductor device including a photodiode and a transistor. In addition, the present invention relates to an electronic device using the semiconductor device.

2. Description of the Related Art

Many photoelectric conversion devices which are used for detecting an electromagnetic wave are generally known, and for example, a photoelectric conversion device having sensitivity from ultra-violet rays to infrared rays is referred to as a photo-sensor in general. The photodiode which is one of the optical sensors can be used in a wavelength region of greater than or equal to 400 nm and less than or equal to 1100 nm, and there are a wide variety of applications as an optical sensor.

In such an optical sensor, a current obtained from a photodiode is generally amplified by an amplifier circuit, and detected. There are some kinds of amplifier circuits that include a differential amplifier (e.g., refer to Reference 1: Japanese Published Patent Application No. H5-215602).

SUMMARY OF THE INVENTION

However, when quantity of light is detected by the above-mentioned optical sensor, an output value changes due to external environment. Therefore, at the time of being used as an optical sensor, illuminance cannot be detected accurately.

In view of the foregoing problems, it is an object of the present invention to obtain a semiconductor device having a more stable photo detection function with external environment.

A semiconductor device of the present invention includes: a first photodiode which detects light; a second photodiode which is shielded from light; a first circuit group including a voltage follower circuit to which an output obtained from one terminal of the first photodiode is inputted; a second circuit group for amplifying or inversing an output obtained from one terminal of the second photodiode if necessary and for adjusting an output from the first circuit group to a voltage based on a voltage under a predetermined temperature; and a compensation circuit. In the compensation circuit, temperature compensation is performed by adding or subtracting a voltage based on a voltage obtained from the second circuit group under a predetermined temperature, to or from a voltage obtained from the first circuit group. Accordingly, an output obtained from the first photodiode is converted into the predetermined temperature, and thus, illumination can be measured more precisely.

Further, a reference potential is supplied to the other terminal of the first photodiode so that an open circuit voltage is outputted from one terminal thereof when light is delivered. In addition, a potential is supplied to the other terminal of the second photodiode so that a forward bias having temperature dependence which is stronger than that of a reverse bias is applied to the second photodiode. With such a structure, a semiconductor device having a photo detection function with a wider range of illumination can be obtained more accurately.

One feature of the present invention is a semiconductor device including: a first photodiode which detects light; a second photodiode which is shielded from light; a first circuit group including a voltage follower circuit to which an output obtained from one terminal of the first photodiode is inputted; a second circuit group having a voltage regulator circuit for adjusting an output obtained from one terminal of the second photodiode to a voltage based on a voltage under a predetermined temperature; and a compensation circuit to which outputs from the first circuit group and the second circuit group are inputted, and the compensation circuit which adds or subtracts each of the outputs, in which a reference potential is supplied to the other terminal of the first photodiode; and a potential is supplied to the other terminal of the second photodiode so that a forward bias is applied to the second photodiode.

In the above structure, each of the first photodiode and the second photodiode includes an n-type semiconductor layer and a p-type semiconductor layer; one terminal of the first photodiode and the other terminal of the second photodiode are electrically connected to the p-type semiconductor layer; and the other terminal of the first photodiode and one terminal of the second photodiode are electrically connected to the n-type semiconductor layer. Furthermore, the second circuit group in the above structure may include a function of amplifying or inverting an output obtained from one terminal of the second photodiode.

Another feature of the present invention is a semiconductor device including: a first photodiode which detects light; a second photodiode which is shielded from light; a first circuit group including a voltage follower circuit to which an output obtained from one terminal of the first photodiode is inputted; a second circuit group having a voltage regulator circuit for adjusting an output obtained from one terminal of the second photodiode to a voltage based on a voltage under a predetermined temperature; and a compensation circuit to which outputs from the first circuit group and the second circuit group are inputted, and the compensation circuit which adds or subtracts each of the outputs, in which a reference potential is supplied to the other terminal of the first photodiode; a potential is supplied to the other terminal of the second photodiode so that a forward bias is applied to the second photodiode; and one terminal of the first photodiode has a higher potential than the other terminal thereof when light is delivered. In addition, the second circuit group may include a function of amplifying or inverting an output obtained from one terminal of the second photodiode.

Another feature of the present invention is a semiconductor device including: a first photodiode which detects light; a second photodiode which is shielded from light; a first circuit group including a voltage follower circuit to which an output obtained from one terminal of the first photodiode is inputted; a second circuit group to which an output obtained from one terminal of the second photodiode is inputted, and which includes an inverting amplifier circuit, an inverter circuit, and a voltage regulator circuit for adjusting an output from the first circuit group to a voltage based on a voltage under a predetermined temperature; and a compensation circuit to which outputs from the first circuit group and the second circuit group are inputted, and which adds or subtracts each of the outputs, in which a reference potential is supplied to the other terminal of the first photodiode; a potential is supplied to the other terminal of the second photodiode so that a forward bias is applied to the second photodiode; and one terminal of the first photodiode has a higher potential than the other terminal thereof when light is delivered.

Another feature of the present invention is a semiconductor device including: a first photodiode which detects light; a second photodiode which is shielded from light; a first circuit group including a voltage follower circuit to which an output obtained from one terminal of the first photodiode is inputted; a second circuit group including an inverting amplifier circuit to which an output obtained from one terminal of the second photodiode is inputted, an inverter circuit, and a voltage regulator circuit for adjusting an output to a voltage based on a voltage under a predetermined temperature; and an adding circuit to which an output from the first circuit group and an output from the second circuit group are inputted, in which a reference potential is supplied to the other terminal of the first photodiode; a potential is supplied to the other terminal of the second photodiode so that a forward bias is applied to the second photodiode; and one terminal of the first photodiode has a higher potential than the other terminal thereof when light is delivered.

In the above structures, each of the first photodiode and the second photodiode includes a p-type semiconductor layer, an n-type semiconductor layer, and an i-type semiconductor layer provided between the p-type semiconductor layer and the n-type semiconductor layer.

In the above structures, the semiconductor device of the present invention includes a transistor. A transistor is an element having at least three terminals including a gate electrode, a drain region, and a source region. A channel forming region is provided between the drain region and the source region. It is difficult to precisely define the source region and the drain region because they can be changed depending on a structure or operating condition of the transistor, and the like. Therefore, in the case of explaining a connection relationship of a transistor in this specification, in relation to two terminals, a drain region and a source region, one electrode connected to either one of the drain and source regions is referred to as a first electrode, and the other electrode is referred to as a second electrode, which may be used for explanation.

Although a case where a transistor is a thin film transistor is described in this specification, the present invention is not particularly limited to this. It is thus possible to use a thin film transistor (TFT) using a non-single crystalline semiconductor film typified by amorphous silicon and polycrystalline silicon, a transistor formed using a semiconductor substrate or an SOI substrate, a MOS transistor, a junction transistor, a bipolar transistor, a transistor using a compound semiconductor such as ZnO or a-InGaZnO, a transistor using an organic semiconductor or a carbon annotate, or the like. Further, the kinds of substrate provided with a transistor are not specifically limited; for example, a single crystalline substrate, an SOI substrate, a glass substrate, a plastic substrate, or the like can be used. Alternatively, after a transistor is formed on a substrate, it may be transferred onto another substrate to be disposed.

In this specification, description "being connected" is synonymous with description "being electrically connected". Accordingly, in the structures disclosed in the present invention, another element which enables an electrical connection (e.g., a switch, a transistor, a capacitor, an inductor, a resistor, a diode, or the like) may be interposed between elements having a predetermined connection relationship. Needless to say, the elements may be arranged without interposing another element there between, and description "being electrically connected" includes the case where elements are directly connected.

According to the present invention, by adding appropriate amendment to external environment, a semiconductor device having an illumination detection function, which is superior in reliability and suppresses the decrease of illumination detection function due to an external factor, particularly, temperature, can be obtained. In addition, a necessary power supply voltage can be lowered by lowering an operating voltage of a circuit included in the semiconductor device. Accordingly, the application range of the semiconductor device of the present invention can be extended further.

BRIEF DESCRIPTION OF THE DRAWINGS

FIGS. 8A to 8C are diagrams illustrating a method for manufacturing a semiconductor device of the present invention.

FIGS. 9A and 9B are diagrams illustrating a method for manufacturing a semiconductor device of the present invention.

DETAILED DESCRIPTION OF THE INVENTION

Embodiment Mode

Figure 1:
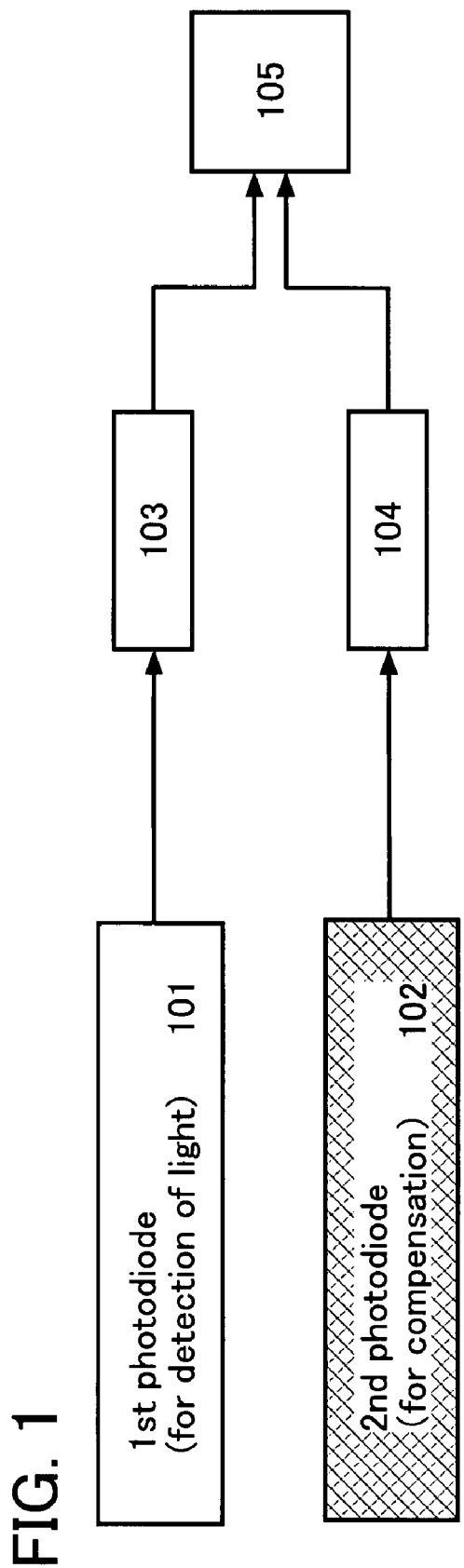
FIG. 1 is a diagram illustrating a basic structure of a semiconductor device of the present invention.

Hereinafter, embodiment modes of the present invention will be described with reference to the accompanying drawings. However, the present invention is not limited to the following description. As is easily known to a person skilled in the art, the mode and the detail of the present invention can be variously changed without departing from the spirit and the scope of the present invention. Thus, the present invention should not be interpreted as being limited to the following description of the embodiment modes. Note that the same reference numerals are commonly used to denote the same components in structures of the present invention explained below, and detail description of the same portion or a portion having a similar function is omitted.

Embodiment Mode 1

This embodiment mode will describe a basic structure of a semiconductor device of the present invention, with reference to FIG. 1. The semiconductor device of the present invention includes at least a first photodiode 101, a second photodiode 102, a first circuit group 103, a second circuit group 104, and a correction circuit 105. Note that the second photodiode 102 is shielded from light, an output obtained from one terminal of the first photodiode 101 is inputted to the first circuit group 103, and an output obtained from one terminal of the second photodiode 102 is inputted to the second circuit group 104. In addition, when light is delivered, a reference potential is supplied to the other terminal of the first photodiode 101 so that an open circuit voltage is outputted from one terminal connected to the first circuit group 103. In addition, a potential is supplied to the other terminal of the second photodiode 102 so that a forward bias having stronger temperature dependence than that of a reverse bias is applied to the second photodiode 102.

The first photodiode 101 is a photodiode for photo detecting, and outputs an open circuit voltage proportional to a logarithmic value of luminance by receiving light. The obtained voltage is inputted to the correction circuit 105 through the first circuit group 103. Note that, in the first circuit group 103, high output impedance obtained from the first photodiode 101 is converted into low output impedance, and an output from the first photodiode 101 is inputted to the next stage more surely. Therefore, in the present invention, the first circuit group 103 includes at least a voltage follower circuit.

On the other hand, the second photodiode 102 is a correction photodiode, and shielded from light to read output characteristics of the photodiode which are caused by temperature or the like other than light. Note that although various external factors can be assumed as an external factor other than light which affects the output characteristics of the photodiode, temperature which greatly affects the output from the first photodiode 101, that is, an open circuit voltage is described here. Therefore, the present invention is not limited to the correction of only temperature precisely. Note that an output from the second photodiode 102, which has temperature dependence, is amplified or inverted if necessary, by using the second circuit group 104 which uses an operation amplifier, and the output from the second photodiode 102 is adjusted to a voltage based on a voltage under a predetermined temperature, and then inputted to the correction circuit 105.

Note that the first circuit group 103 may have an inversion means in some cases in accordance with the kind of the correction circuit 105, or positive or negative of an output voltage which is desired to be obtained from the correction circuit 105.

The output voltages obtained from the first circuit group 103 and the second circuit group 104 are inputted to the correction circuit 105. In the correction circuit 105, temperature compensation is performed by adding or subtracting an output voltage based on a voltage obtained from the second circuit group 104 under a predetermined temperature to or from an output voltage obtained from the first circuit group 103. Namely, an output obtained from the first photodiode 101 can be converted into the predetermined temperature. In this manner, an output fluctuation due to temperature of the first photodiode 101 can be removed using the second photodiode 102. Accordingly, when light is detected, illumination can be measured more precisely by removing an external factor other than light.

In addition, an output from the first photodiode 101 which is used for detecting luminance, that is, an open circuit voltage is proportional to a logarithmic value of luminance; therefore, the semiconductor device of the present invention can detect light in a wide range of illumination.

Note that an adder is preferably used for the correction circuit 105; however, the present invention is not limited to this, and a subtract or may also be used. Further, by connecting an external load or the like to the correction circuit 105, an output may also be performed in a desired form.

Next, one structural example of the above-described component will be described. This embodiment mode shows an example in which an inverting adder circuit is used for the correction circuit 105. First, the first photodiode 101 and the voltage follower circuit included in the first circuit group 103 are described with reference to FIG. 2.

Figure 2:
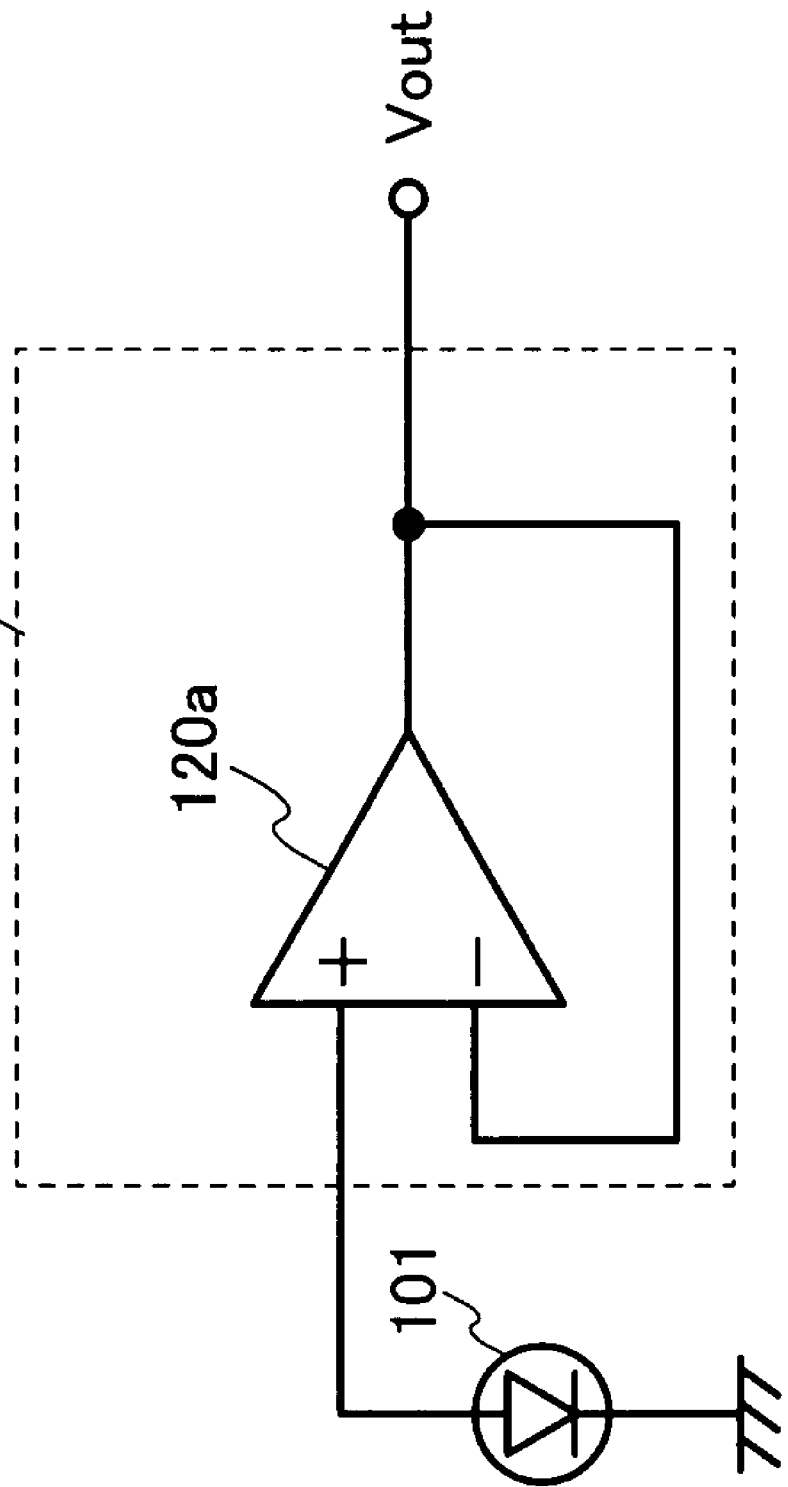
FIG. 2 is a diagram illustrating a semiconductor device of the present invention.

As shown in FIG. 2, a first terminal of the first photodiode 101 is connected to ground (GND), and a second terminal thereof is connected to a noninverting input terminal of an operational amplifier 120a included in a voltage follower circuit 121. By using such open circuit voltage which is generated such that the first photodiode 101 is irradiated with light, illuminance is detected. Since the open circuit voltage is proportional to a logarithmic value of illuminance, light can be detected in a wide range of illuminance. Note that the voltage obtained from the first photodiode 101 is inputted to the noninverting input terminal of the operational amplifier 120a. On the other hand, an output voltage of the operational amplifier 120a is inputted to the inverting input terminal.

Figure 3:
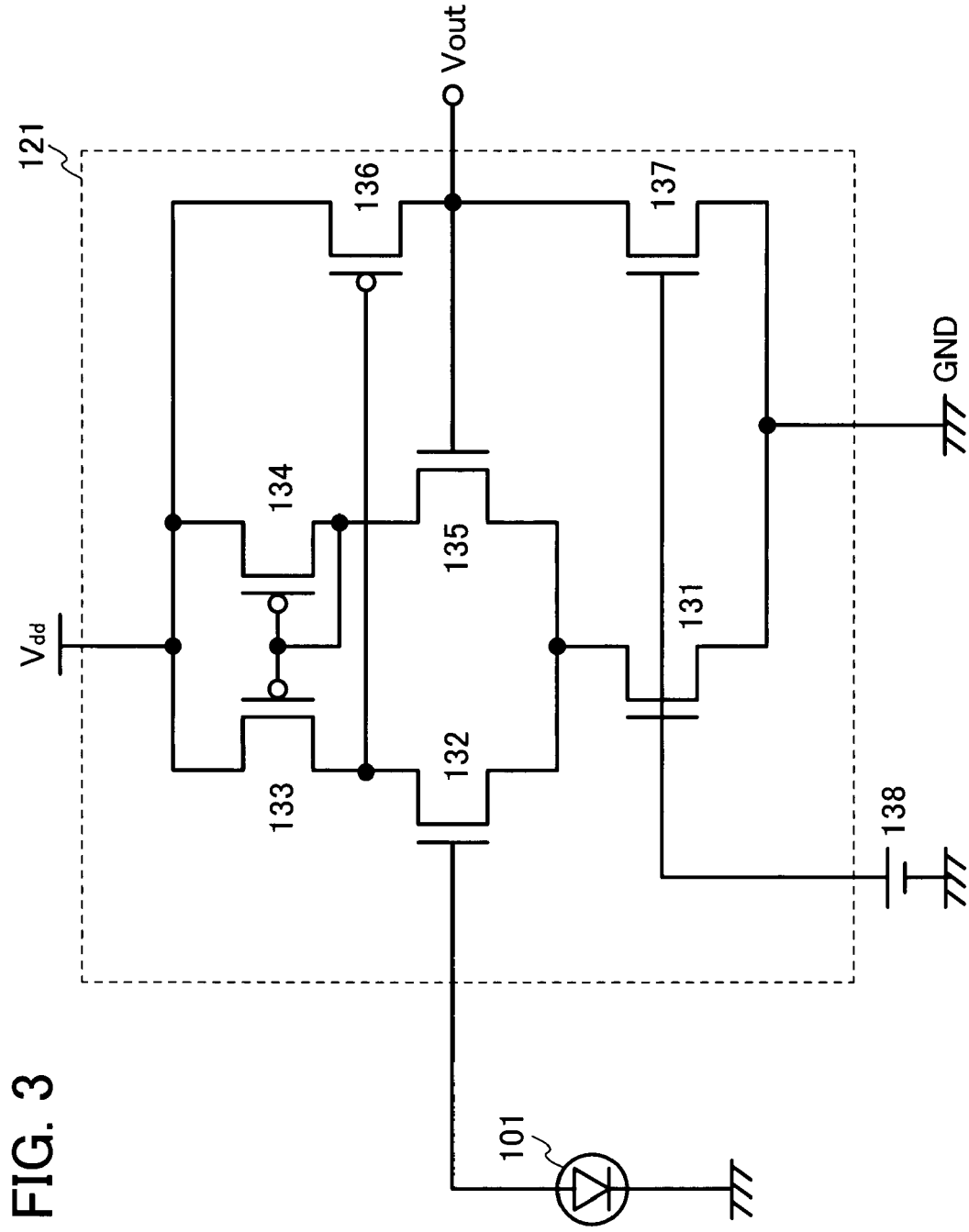
FIG. 3 is a diagram illustrating a semiconductor device of the present invention.

One structure of the voltage follower circuit 121 will be described with reference to FIG. 3. The voltage follower circuit 121 includes a first transistor 131, a second transistor 132, a third transistor 133, a fourth transistor 134, a fifth transistor 135, a sixth transistor 136, and a seventh transistor 137. Note that polarities of the first transistor 131, the second transistor 132, the fifth transistor 135, and the seventh transistor 137 are different from those of the third transistor 133, the fourth transistor 134, and the sixth transistor 136. This embodiment mode describes the case where an n-channel transistor is used for each of the first transistor 131, the second transistor 132, the fifth transistor 135, and the seventh transistor 137, and a p-channel transistor is used for each of the third transistor 133, the fourth transistor 134, and the sixth transistor 136.

The first photodiode 101 is connected to a gate electrode of the second transistor 132, a first electrode (one of a source electrode and a drain electrode) of the second transistor 132 is connected to a second electrode of the third transistor 133 and a gate electrode of the sixth transistor 136. On the other hand, a second electrode (the other of the source electrode and the drain electrode) of the second transistor 132 is connected to a first electrode of the first transistor 131 and a second electrode of the fifth transistor 135. In addition, a first electrode of the fifth transistor 135 is connected to a second electrode of the fourth transistor 134, a gate electrode thereof, and a gate electrode of the third transistor 133. A first electrode of the sixth transistor 136 is connected to a first electrode of the third transistor 133 and a first electrode of the fourth transistor 134; and a potential Vdd is supplied to these first electrodes. In addition, a second electrode of the sixth transistor 136 is connected to a gate electrode of the fifth transistor 135 and a first electrode of the seventh transistor 137. A second electrode of the seventh transistor 137 is connected to a second electrode of the first transistor 131, and these second electrodes are connected to ground (GND). Further, a gate electrode of the first transistor 131 and a gate electrode of the seventh transistor 137 are connected to each other, and a potential that makes the first transistor 131 and the seventh transistor 137 become conductive states is supplied to these gate electrodes by using a power supply 138.

Note that a potential of a connection point among the second electrode of the sixth transistor 136, the gate electrode of the fifth transistor 135, and the first electrode of the seventh transistor 137 is obtained as an output voltage Vought of the voltage follower circuit 121.

By using the above-described voltage follower circuit 121, a potential of the second electrode of the sixth transistor 136 is fed back to the gate electrode of the fifth transistor 135, so that an output voltage which is impedance-converted and is the same as a voltage inputted to the gate electrode of the second transistor 132 can be outputted from the voltage follower circuit 121. Note that it is preferable that a channel width of the sixth transistor 136 be set larger than a channel width of the seventh transistor 137 so as not to reduce the potential of the first electrode of the seventh transistor 137 due to this output.

In addition, since a potential supplied from the power supply 138 may be a potential that makes the first transistor 131 and the seventh transistor 137 become conductive states, a potential of GND+Vth or more may be used when a larger value between a threshold voltage of the first transistor 131 and a threshold voltage of the seventh transistor 137 is set Vth. Thus, a power supply voltage in the power supply 138 can be set low, and a potential supplied from the power supply 138 can be generated using Vdd and GND supplied to the voltage follower circuit 121; therefore, an operating voltage of the voltage follower circuit 121 can be lowered. Note that the voltage supplied to the voltage follower circuit 121, that is, |Vdd−GND| may be greater than or equal to the total of the threshold values of the first transistor 131, the second transistor 132, and the third transistor 133.

In addition, the voltage follower circuit 121 is not limited to the above example as long as an output voltage which is the same as the voltage inputted and is impedance-converted can be obtained. For example, the third transistor 133 and the fourth transistor 134 form a current mirror circuit, and a structure in which a transistor having a similar function to the third transistor 133 is further provided in parallel to the third transistor 133 in the current mirror circuit may be used. However, in this case, transistors having similar functions to the first transistor 131 and the second transistor 132 are necessary to be provided in parallel to the first transistor 131 and the second transistor 132 so that potentials of these first electrodes of the first transistor 131 and the second transistor 132 are kept similarly to a potential in the case of one stage. Needless to say, the potentials of these second electrodes of the third transistor 133 and the fourth transistor 134 are necessary to be the same.

The output voltage Vought obtained in this way is an output from the first circuit group 103 in FIG. 1, and inputted to the correction circuit 105. Note that FIG. 2 describes the case of one first photodiode 101; however, a large number of the first photodiodes 101 may be provided in series.

Next, the second photodiode 102 and the second circuit group 104 in FIG. 1 will be described with reference to FIG. 4. Note that this embodiment mode describes the case where an inverting amplifier circuit 150, a voltage regulator circuit 155, and an inverter circuit 154 which is provided between the inverting amplifier circuit 150 and the voltage regulator circuit 155 are provided in the second circuit group 104.

Figure 4:
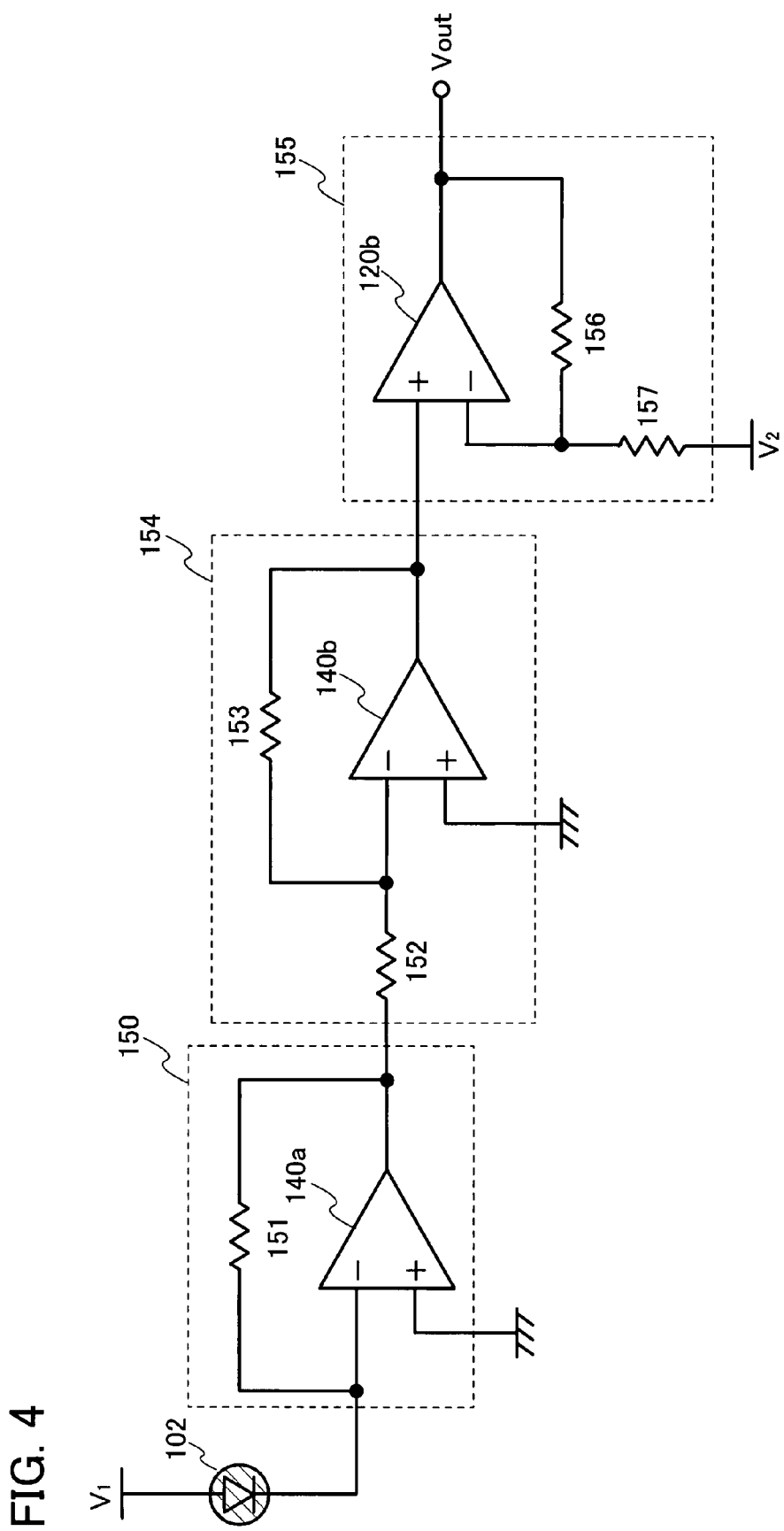
FIG. 4 is a diagram illustrating a semiconductor device of the present invention.

As shown in FIG. 4, a potential V1 which is higher than GND is supplied to a second terminal of the second photodiode 102 which is shielded from light, and a first terminal of the second photodiode 102 is connected to an inverting input terminal of an operational amplifier 140a included in the inverting amplifier circuit 150. On the other hand, a noninverting input terminal of the operational amplifier 140a is connected to ground (GND), and an output terminal of the operational amplifier 140a is connected to the inverting input terminal of the operational amplifier 140a through a resistor 151. In addition, the output terminal of the operational amplifier 140a is connected to an inverting input terminal of the operational amplifier 140b through a resistor 152 included in the inverter circuit 154 of the next stage, and an output voltage from the inverting amplifier circuit 150 is inputted to the inverter circuit 154.

Figure 5:
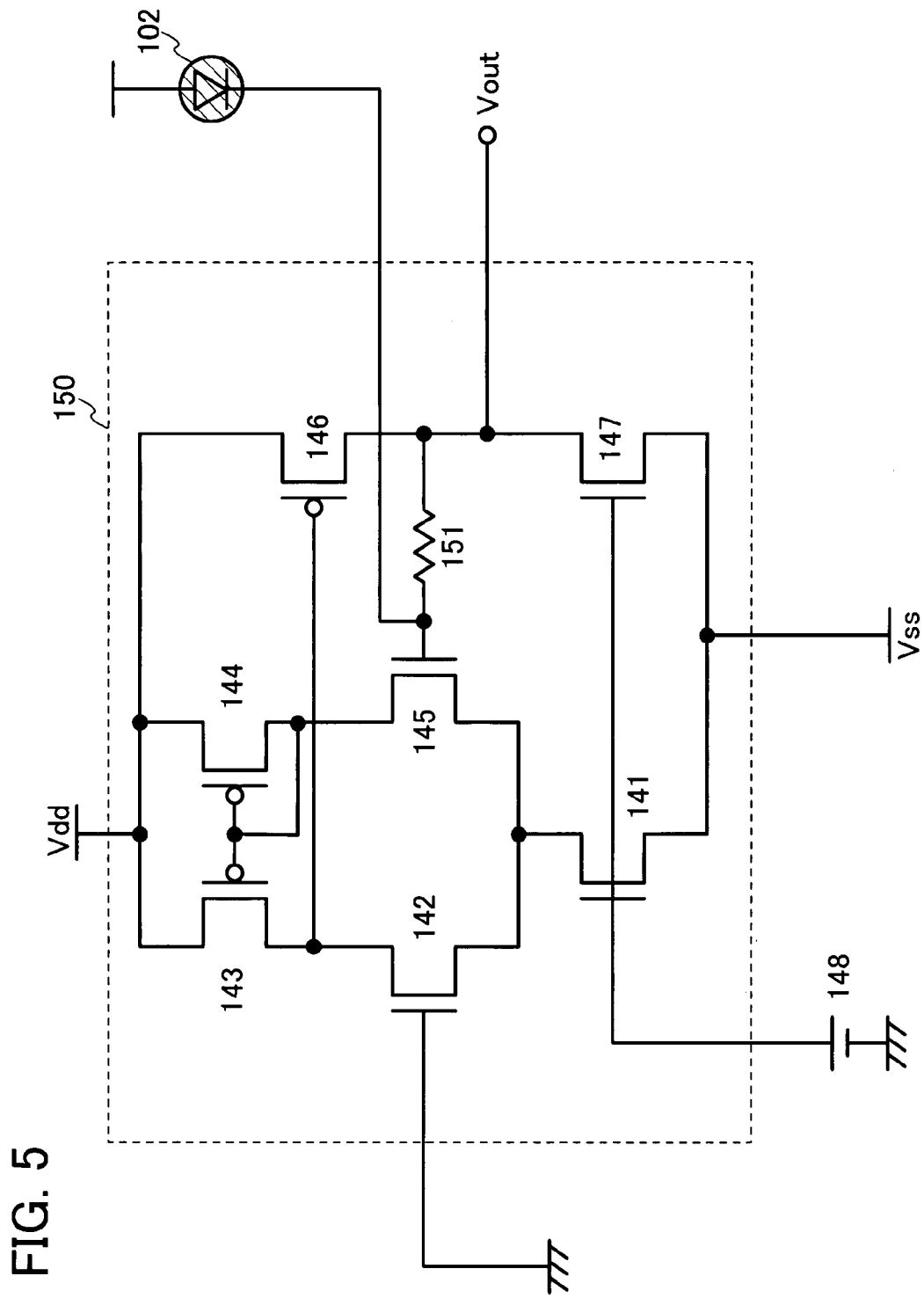
FIG. 5 is a diagram illustrating a semiconductor device of the present invention.

One structure of the inverting amplifier circuit 150 will be described with reference to FIG. 5. The inverting amplifier circuit 150 includes a first transistor 141, a second transistor 142, a third transistor 143, a fourth transistor 144, a fifth transistor 145, a sixth transistor 146, a seventh transistor 147, and the resistor 151. Note that polarities of the first transistor 141, the second transistor 142, the fifth transistor 145, and the seventh transistor 147 are different from those of the third transistor 143, the fourth transistor 144, and the sixth transistor 146. This embodiment mode describes the case where an n-channel transistor is used for each of the first transistor 141, the second transistor 142, the fifth transistor 145, and the seventh transistor 147, and a p-channel transistor is used for each of the third transistor 143, the fourth transistor 144, and the sixth transistor 146.

An output voltage from the second photodiode 102, that is, an input voltage to the inverting amplifier circuit 150 is inputted to a gate electrode of the fifth transistor 145. A gate electrode of the second transistor 142 is connected to ground (GND), and a first electrode of the second transistor 142 is connected to a second electrode of the third transistor 143 and a gate electrode of the sixth transistor 146. On the other hand, a second electrode of the second transistor 142 is connected to a first electrode of the first transistor 141 and a second electrode of the fifth transistor 145. In addition, a first electrode of the fifth transistor 145 is connected to a second electrode of the fourth transistor 144, a gate electrode of the fourth transistor 144, and a gate electrode of the third transistor 143. A first electrode of the third transistor 143 is connected to first electrodes of the sixth transistor 146 and the fourth transistor 144; and a potential Vdd is supplied to these first electrodes. Further, a second electrode of the sixth transistor 146 is connected to a first electrode of the seventh transistor 147 and the gate electrode of the fifth transistor 145 through the resistor 151. In addition, a second electrode of the seventh transistor 147 is connected to a second electrode of the first transistor 141, and these second electrodes are connected to Vss. In addition, a gate electrode of the first transistor 141 and a gate electrode of the seventh transistor 147 are connected to each other, and a potential that makes the first transistor 141 and the seventh transistor 147 become conductive states is supplied to these gate electrodes by using a power supply 148.

An output voltage Vought of the inverting amplifier circuit 150 is obtained from a potential of a connection point between the second electrode of the sixth transistor 146 and the first electrode of the seventh transistor 147. Note that it is preferable that a channel width of the sixth transistor 146 be set larger than a channel width of the seventh transistor 147 so as not to reduce the potential of the first electrode of the seventh transistor 147 due to this output from the inverting amplifier circuit 150.

In addition, since a potential supplied from the power supply 148 may be a potential that makes the first transistor 141 and the seventh transistor 147 become conductive states, a value of Vss+Vth or more may be used when a larger value between a threshold voltage of the first transistor 141 and a threshold voltage of the seventh transistor 147 is set Vth. Thus, a power supply voltage in the power supply 148 can be set low, and a potential supplied from the power supply 148 can be generated using Vss and Vdd supplied to the inverting amplifier circuit 150; therefore, an operating voltage of the inverting amplifier circuit 150 can be lowered. Depending on a potential of Vss, the power supply 148 may use GND and Vdd supplied to the voltage follower circuit 121, or the power supply 138 of the voltage follower circuit 121 in FIG. 3. Note that the voltage supplied to the inverting amplifier circuit 150, that is, |Vdd−Vss| may be greater than or equal to the total of the threshold values of the first transistor 141, the second transistor 142, and the third transistor 143.

In addition, the third transistor 143 and the fourth transistor 144 form a current mirror circuit, and a structure in which a transistor having a similar function to the third transistor 143 is further provided in parallel to the third transistor 143 in the current mirror circuit may be used. However, in this case, transistors having similar functions to the first transistor 141 and the second transistor 142 are necessary to be provided in parallel to the first transistor 141 and the second transistor 142 so that potentials of these first electrodes of the first transistor 141 and the second transistor 142 are kept similarly to a potential in the case of one stage. Needless to say, the potentials of the second electrodes of the third transistor 143 and the fourth transistor 144 are necessary to be the same.

The output voltage from the inverting amplifier circuit 150 obtained in this manner is inputted to the inverter circuit 154 in FIG. 4. Note that the output terminal of the operational amplifier 140a included in the inverting amplifier circuit 150 is connected to the inverting input terminal of the operational amplifier 140b through the resistor 152 included in the inverter circuit 154. In addition, a noninverting input terminal of the operational amplifier 140b is connected to GND, and an output terminal of the operational amplifier 140b is connected to the inverting input terminal of the operational amplifier 140b through a resistor 153. Note that the output voltage of the inverter circuit 154 can be obtained from a potential of the output terminal of the operational amplifier 140b. Here, the output obtained from the second photodiode 102 is amplified using the resistor 151 included in the inverting amplifier circuit 150, and resistance values of the resistor 152 and the resistor 153 are the same and only inversion is performed in the inverter circuit 154. Note that the operational amplifier 140b included in the inverter circuit 154 is similar to the above-described operational amplifier 140a; therefore, detailed description thereof is omitted here.

Next, the output terminal of the operational amplifier 140b is connected to a noninverting input terminal of the operational amplifier 120b included in the voltage regulator circuit 155, and the output voltage from the inverter circuit 154 is inputted to the voltage regulator circuit 155. In addition, an inverting input terminal of the operational amplifier 120b included in the voltage regulator circuit 155 is connected to a potential V2 through a resistor 157, and an output terminal of the operational amplifier 120b is connected to the noninverting input terminal of the operational amplifier 120b through a resistor 156. Note that an output voltage Vought of the voltage regulator circuit 155 can be obtained from a potential of the output terminal of the operational amplifier 120b. The operational amplifier 120b included in the voltage regulator circuit 155 is similar to the above-described operational amplifier 120a; therefore, detailed description thereof is omitted here.

Note that as a potential V1 which is supplied to the first terminal of the second photodiode 102, a potential in a region where a current characteristic to temperature in the second photodiode 102 becomes linear is selected. Accordingly, V1 may be a potential satisfying the condition, and V1 can be the potential Vdd or less which is supplied to the operational amplifier 120a, the operational amplifier 120b, the operational amplifier 140a, the operational amplifier 140b, or the like.

In addition, an input voltage is adjusted to a voltage value such that a voltage under a predetermined temperature is set 0 V in the voltage regulator circuit 155. Accordingly, when resistance values of the resistor 156 and the resistor 157 are equal to each other, V2 may supply a potential that is twice as large as a voltage under a predetermined temperature. Note that, although the case where the resistance values of the resistor 156 and the resistor 157 are equal to each other is described here, (1+(the resistor 156)/(the resistor 157)) times as much potential as a voltage value under a predetermined temperature may be supplied when the ratio of resistance values of the resistor 156 and the resistor 157 is not 1:1. In addition, a resistance value of the resistor 151 included in the inverting amplifier circuit 150 is set such that temperature dependence of an output from the first photodiode 101 in FIG. 1 and temperature dependence of an output from the voltage regulator circuit 155 are equal to each other. Therefore, the resistance value of the resistor 151 is necessary to be set in consideration of the resistance values of the resistor 156 and the resistor 157 in the voltage regulator circuit 155. Note that, in the inverter circuit 154, although the case where the resistance values of the resistor 152 and the resistor 153 are equal to each other is described, an amplification function can be provided by changing the ratio of these resistors. In that case, needless to say, the resistance values of the inverting amplifier circuit 150 and the voltage regulator circuit 155 are necessary to be set in consideration of this resistance value.

Such an output obtained from the second photodiode 102 through the inverting amplifier circuit 150, the inverter circuit 154, and the voltage regulator circuit 155 is set as an output from the second circuit group 104 and inputted to the correction circuit 105 in FIG. 1. In addition, the second circuit group 104 is not limited to the above-described structure and may have another inverter circuit. In that case, another inverter circuit is necessary to be added to the first circuit group 103.

Next, the correction circuit 105 which adds or subtracts an output from the first circuit group 103 and an output from the second circuit group 104 will be described with reference to FIG. 6. Note that the output voltage from the first circuit group 103 is referred to as Va, and the output voltage from the second circuit group 104 is referred to as Vb. This embodiment mode describes an example in which an inverting adder circuit is used as the correction circuit 105, as described above. Note that since the operational amplifier 140 included in an inverting adder circuit 160 is similar to the above-described operational amplifier 140a and operational amplifier 140b, detailed description thereof is omitted.

Figure 6:
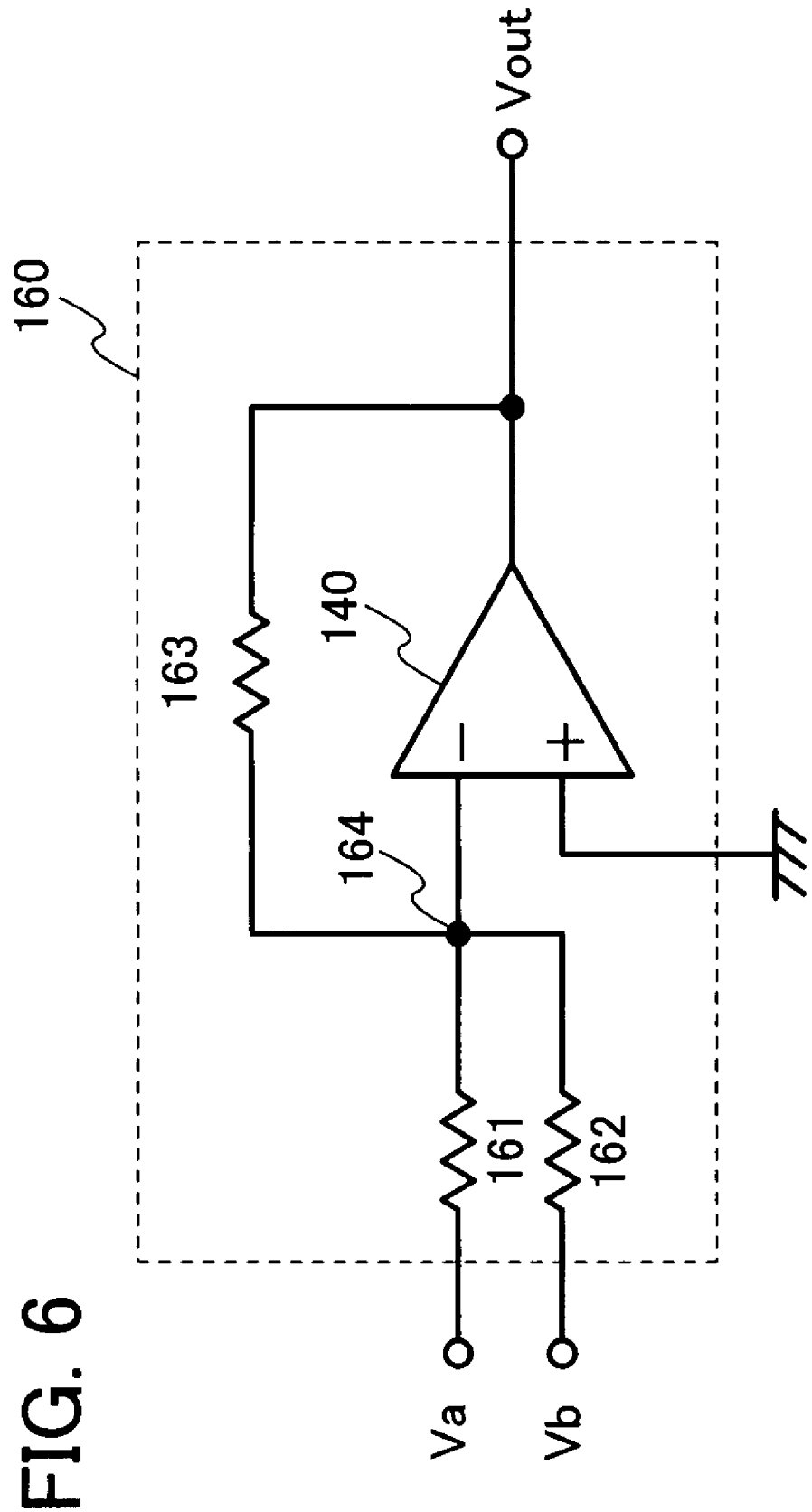
FIG. 6 is a diagram illustrating a semiconductor device of the present invention.

As shown in FIG. 6, an output terminal in the first circuit group 103 is connected to an inverting input terminal of the operational amplifier 140 through a resistor 161, and an output terminal in the second circuit group 104 is connected to the inverting input terminal of the operational amplifier 140 through a resistor 162, similarly. Note that when a portion where output terminals of respective circuit groups are connected to each other through respective resistors is a node 164, an output terminal of the operational amplifier 140 is connected to the inverting input terminal of the operational amplifier 140 through a resistor 163 and the node 164. On the other hand, the noninverting input terminal is connected to ground (GND). When an operation of the inverting adder circuit 160 is only to add an output voltage Va and an output voltage Vb here, resistance values of the resistor 161, the resistor 162, and the resistor 163 may be the same as each other. Note that the present invention is not limited to this; values of these resistors may be selected as appropriate in the case where an output may be amplified or the like.

By using the above-described inverting adder circuit 160, an output voltage Va obtained from the first circuit group and an output voltage Vb obtained from the second circuit group can be added.

In this manner, in the correction circuit 105 shown in FIG. 1, temperature compensation is performed by adding or subtracting a voltage based on a voltage obtained from the second circuit group 104 under a predetermined temperature to or from a voltage obtained from the first circuit group 103. Namely, an output obtained from the first photodiode 101 can be converted into the predetermined temperature using the second photodiode 102. In this manner, an output fluctuation due to temperature of the first photodiode 101 can be removed. Accordingly, when light is detected, illumination can be measured more precisely by removing an external factor other than light.

Embodiment Mode 2

This embodiment mode will describe a method for manufacturing a semiconductor device in the present invention. Note that an example of a fragmentary sectional view in which transistors forming a circuit group, and first and second photodiodes in the present invention are extracted is shown in FIGS. 7A to 9B, and description is given using the example.

Figure 7A:
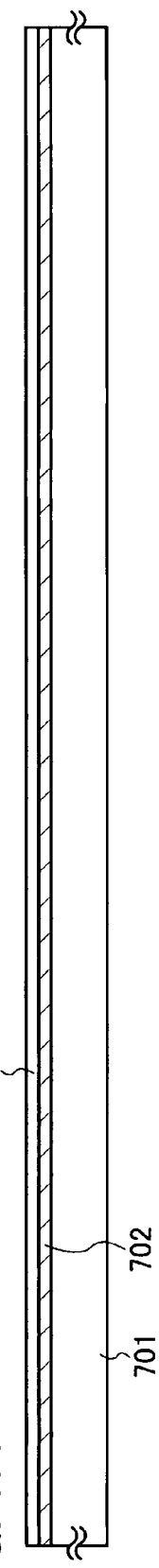
FIGS. 7A to 7D are diagrams illustrating a method for manufacturing a semiconductor device of the present invention.

First, an insulating film 702 which functions as a base film and a semiconductor film 703 (e.g., a film containing amorphous silicon) are stacked over one surface of a substrate 701, as shown in FIG. 7A.

Note that the substrate 701 can be selected from a glass substrate, a quartz substrate, a metal substrate (e.g., a ceramic substrate, a stainless steel substrate, or the like), or a semiconductor substrate such as a Si substrate. Alternatively, as a plastic substrate, a substrate of polyethylene terephthalate (PET), polyethylene naphtha late (PEN), polyether sulfide (PES), acrylic, or the like can be selected.

The insulating film 702 is formed using an insulating material such as silicon oxide, silicon nitride, silicon ox nitride ($SiO_xN_y$) (x>y>0), or silicon nitride oxide ($SiN_xO_y$) (x>y>0), by a CVD method, a sputtering method, or the like. For example, in the case where the insulating film 702 has a two-layer structure, a silicon nitride oxide film may be formed as a first insulating film and a silicon ox nitride film may be formed as a second insulating film. Alternatively, a silicon nitride film may be formed as the first insulating film and a silicon oxide film may be formed as the second insulating film. The insulating film 702 functions as a blocking layer which prevents an impurity element from being mixed from the substrate 701 into an element formed over the insulating film 702. By forming the insulating film 702 which functions as a blocking layer in this manner, it is possible to prevent alkaline earth metal or alkali metal such as Na in the substrate 701 from adversely affecting the element to be formed over the insulating film 702. In the case of using quartz as the substrate 701, the insulating film 702 may be omitted.

Figure 7B:
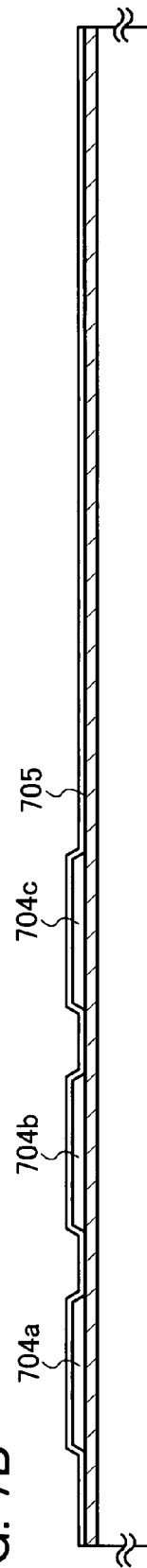

Next, the semiconductor film 703 is crystallized by being irradiated with laser light. The semiconductor film 703 may be crystallized by a method or the like in which a laser irradiation method is combined with a thermal crystallization method using RTA or an annealing furnace or a thermal crystallization method using a metal element for promoting crystallization. After that, as shown in FIG. 7B, the crystalline semiconductor film obtained is etched so as to have a desired shape; thereby forming crystalline semiconductor films 704a to 704c. Then, a gate insulating film is formed so as to cover at least the crystalline semiconductor films 704a to 704c.

Note that a gate insulating film 705 is formed so as to cover the semiconductor films 704a to 704c here.

The gate insulating film 705 is formed using an insulating material such as silicon oxide, silicon nitride, silicon oxynitride ($SiO_xN_y$), (x>y>0), or silicon nitride oxide ($SiN_xO_y$), (x>y>0), by a CVD method, a sputtering method, or the like. For example, in the case where the gate insulating film 705 has a two-layer structure, a silicon ox nitride film may be formed as a first insulating film and a silicon nitride oxide film may be formed as a second insulating film. Alternatively, a silicon oxide film may be formed as the first insulating film and a silicon nitride film may be formed as the second insulating film.

An example of a manufacturing step of the crystalline semiconductor films 704a to 704c will be briefly described. First, an amorphous semiconductor film having a thickness of 50 to 60 nm is formed by a plasma CVD method. Next, a solution containing nickel that is a metal element for promoting crystallization is retained on the amorphous semiconductor film, and dehydrogenation treatment (at 500° C., for one hour) and thermal crystallization treatment (at 550° C., for four hours) are performed on the amorphous semiconductor film; thereby forming a crystalline semiconductor film. After that, the crystalline semiconductor film is irradiated with laser light, and a photolithography method is used, so that the crystalline semiconductor films 704a to 704c are formed. Note that without conducting the thermal crystallization using the metal element for promoting crystallization, the amorphous semiconductor film may be crystallized only by laser light irradiation.

As a laser oscillator which is used for crystallization, a continuous wave laser beam (a CW laser beam) or a pulsed wave laser beam (a pulsed laser beam) can be used. As a laser beam which can be used here, a laser beam emitted from one or more of the following can be used: a gas laser such as an Ar laser, a Kr laser or an exciter laser; a laser of which the medium is single crystalline YAG, $YVO_4$, forsterite ($Mg_2SiO_4$), $YAlO_3$, $GdVO_4$, or polycrystalline (ceramic) YAG, $Y_2O_3$, $YVO_4$, $YAlO_3$, $GdVO_4$, to which one or more of Nd, Yb, Cr, Ti, Ho, Er, Tm and Ta as a do pant is added; a glass laser; a ruby laser; an alexandrite laser; a Ti: sapphire laser; a copper vapor laser; or a gold vapor laser. It is possible to obtain crystals with a large grain size when fundamental waves of such laser beams or second to fourth harmonics of the fundamental waves are used. For example, the second harmonic (532 nm) or the third harmonic (355 nm) of an Nd: $YVO_4$ laser (fundamental wave of 1064 nm) can be used. A power density of the laser at this time is necessary to be about 0.01 to 100 $MW/cm^2$ (preferably, 0.1 to 10 $MW/cm^2$). Irradiation is conducted with a scanning rate of about 10 to 2000 cm/sec. Note that a laser using, as a medium, single crystalline YAG, $YVO_4$, first-rate ($Mg_2SiO_4$), $YAlO_3$, or $GdVO_4$ or polycrystalline (ceramic) YAG, $Y_2O_3$, $YVO_4$, $YAlO_3$, or $GdVO_4$ to which one or more of Nd, Yb, Cr, Ti, Ho, Er, Tm, and Ta as a dopant is added; an Ar ion laser; or a Ti: sapphire laser can be continuously oscillated. Furthermore, pulse oscillation thereof can be performed at a repetition rate of 10 MHz or more by carrying out a Q-switch operation, mode synchronization or the like. In the case where a laser beam is oscillated at a repetition rate of 10 MHz or more, after a semiconductor film is melted by a laser and before it is solidified, the semiconductor film is irradiated with a next pulse. Therefore, unlike the case of using a pulsed laser with a low repetition rate, a solid-liquid interface can be continuously moved in the semiconductor film, so that crystal grains which continuously grow in a scanning direction can be obtained.

Alternatively, the gate insulating film 705 may be formed by performing the above-described high-density plasma treatment on the semiconductor films 704a to 704c to oxidize or nitride the surfaces. For example, the film is formed by plasma treatment introducing a mixed gas of a rare gas such as He, Ar, Kr or Xe and oxygen, nitrogen oxide ($NO_2$), ammonia, nitrogen, hydrogen or the like. When excitation of the plasma in this case is performed by introduction of a microwave, high-density plasma can be generated with a low electron temperature. By an oxygen radical (there is the case where an OH radical is included) or a nitrogen radical (there is the case where an NH radical is included) generated by this high-density plasma, the surface of the semiconductor film can be oxidized or nitride.

By treatment using such high-density plasma, an insulating film having a thickness of 1 to 20 nm, typically 5 to 10 nm, is formed over a semiconductor film. Since the reaction of this case is a solid-phase reaction, interface state density between the insulating film and the semiconductor film can be extremely low. Since such high-density plasma treatment oxidizes (or nitrides) a semiconductor film (crystalline silicon, or polycrystalline silicon) directly, unevenness of a thickness of the insulating film to be formed can be extremely small, ideally. In addition, oxidation is not strengthened even in a crystal grain boundary of crystalline silicon, which makes a very preferable condition. That is, by a solid-phase oxidation of the surface of the semiconductor film by the high-density plasma treatment shown here, an insulating film with good uniformity and low interface state density can be formed without causing oxidation reaction abnormally in a crystal grain boundary.

As the gate insulating film 705, an insulating film formed by the high-density plasma treatment may be used by itself, or an insulating film of silicon oxide, silicon ox nitride, silicon nitride or the like may be formed there over by a CVD method using plasma or thermal reaction, so as to make stacked layers. In any case, a transistor including an insulating film formed by high-density plasma, in a part of the gate insulating film or in the whole gate insulating film, can reduce characteristic variation.

Furthermore, the semiconductor films 704a to 704c obtained by irradiating a semiconductor film with a continuous wave laser beam or a laser beam oscillated at a repetition rate of 10 MHz or more and scanning the semiconductor film in one direction for crystallization, have a characteristic that the crystal grows in the scanning direction of the beam. When a transistor is placed so that the scanning direction is aligned with the channel length direction (the direction in which a carrier flows when a channel formation region is formed) and the above-described gate insulating layer is used, a thin film transistor (TFT) with fewer characteristic variation and high field-effect mobility can be obtained.

Next, a first conductive film and a second conductive film are stacked over the gate insulating film 705. Here, the first conductive film having a thickness of 20 to 100 nm is formed by a CVD method, a sputtering method, or the like. The second conductive film having a thickness of 100 to 400 nm is formed. The first conductive film and the second conductive film can be formed using an element selected from tantalum (Ta), tungsten (W), titanium (Ti), molybdenum (Mo), aluminum (Al), copper (Cu), chromium (Cr), niobium (Nb) or the like, or an alloy material or a compound material containing the above-described element as its main component. Alternatively, they may be formed using a semiconductor material typified by polycrystalline silicon doped with an impurity element such as phosphorus. As examples of a combination of the first conductive film and the second conductive film, a tantalum nitride film and a tungsten film, a tungsten nitride film and a tungsten film, a molybdenum nitride film and a molybdenum film, and the like can be given. Since tungsten and tantalum nitride have high heat resistance, heat treatment for thermal activation can be performed after the first conductive film and the second conductive film are formed. In addition, in the case of a three-layer structure instead of a two-layer structure, a stacked-layer structure of a molybdenum film, an aluminum film and a molybdenum film may be adopted.

Figure 7C:
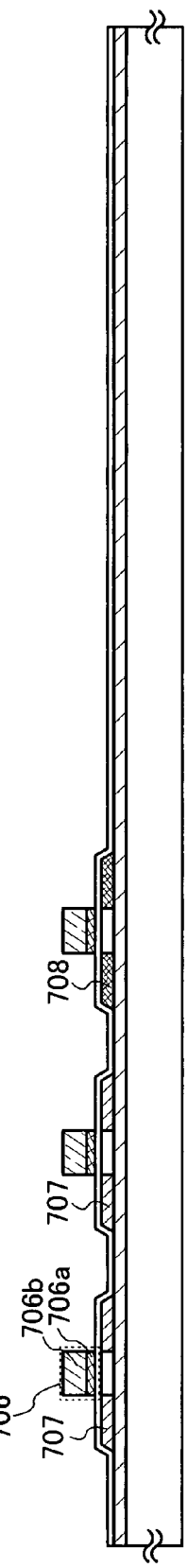

Next, a resist mask is formed by using a photolithography method, and etching treatment for forming a gate electrode and a gate line is performed, so that gate electrodes 706 are formed over the semiconductor films 704a to 704c, as shown in FIG. 7C. Here, an example is shown, in which one of the gate electrodes 706 has a stacked-layer structure of a first conductive film 706a and a second conductive film 706b.

Next, the gate electrodes 706 are used as masks, and an impurity element imparting n-type conductivity is added at low concentration to the semiconductor films 704a to 704c, by an ion doping method or an ion implantation method. Then, a resist mask is selectively formed by a photolithography method, and an impurity element imparting p-type conductivity is added at high concentration to the semiconductor films 704a to 704c. As an impurity element which shows n-type conductivity, phosphorus (P), arsenic (As), or the like can be used. As an impurity element which shows p-type conductivity, boron (B), aluminum (Al), gallium (Ga), or the like can be used. Here, phosphorus (P) is used as an impurity element imparting n-type conductivity and selectively introduced into the semiconductor films 704a to 704c so that they contain phosphorus (P) at a concentration of $1\times10^{15}$ to $1\times10^{19}/cm^3$, and thus, n-type impurity regions 707 are formed. In addition, boron (B) is used as an impurity element imparting p-type conductivity and selectively introduced into the semiconductor film 704c so that it contains boron (B) at a concentration of $1\times10^{19}$ to $1\times10^{20}/cm^3$, and thus, p-type impurity regions 708 are formed.

Figure 7D:
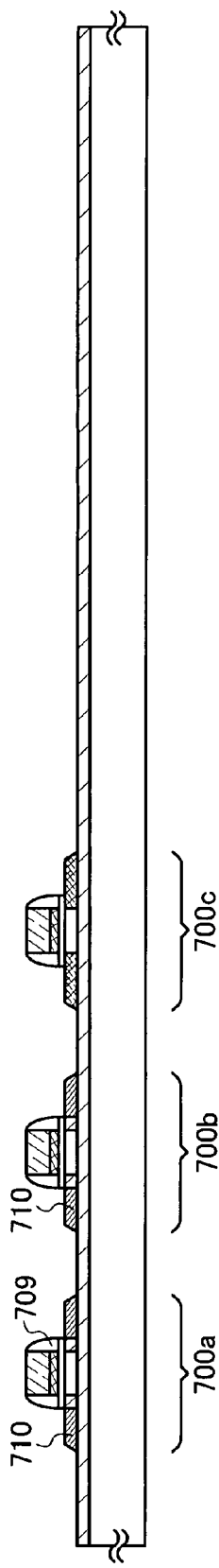

Next, an insulating film is formed so as to cover the gate insulating film 705 and the gate electrodes 706. The insulating film is formed as a single layer or stacked layers of a film containing an inorganic material such as silicon, silicon oxide, or silicon nitride, or an organic material such as an organic resin, by a plasma CVD method, a sputtering method, or the like. Next, the insulating film is selectively etched by anisotropic etching which mainly etches in a vertical direction, so that insulating films 709 (also referred to as side walls) which are in contact with side surfaces of the gate electrodes 706 are formed as shown in FIG. 7D. The insulating films 709 are used as masks for doping when LDD (Lightly Doped Drain) regions are formed.

Next, using a resist mask formed by a photolithography method, the gate electrodes 706 and the insulating films 709 as masks, an impurity element imparting n-type conductivity is added at high concentration to the semiconductor films 704a and 704b, so that n-type impurity regions 710 are formed. Here, phosphorus (P) is used as an impurity element imparting n-type conductivity and selectively introduced into the semiconductor films 704a and 704b so that they contain phosphorus (P) at a concentration of $1\times10^{19}$ to $1\times10^{20}/cm^3$, and thus, the high concentration n-type impurity regions 710 are formed.

By the above-described steps, n-channel thin film transistors 700a and 700b, and a p-channel thin film transistor 700c are formed. In this manner, by forming a plurality of thin film transistors in the same step, so that production cost can be reduced and reliability can be improved.

Note that, in the n-channel thin film transistor 700a, a channel formation region is formed in a region of the semiconductor film 704a, which overlaps with one of the gate electrodes 706; the impurity regions 710 which function as a source region and a drain region are formed in regions which do not overlap with the gate electrodes 706 and the insulating films 709; and lightly doped drain regions (LDD regions) are formed in regions which overlap with the insulating films 709 and are located between the channel formation region and the impurity regions 710. In addition, the n-channel thin film transistor 700b is similarly provided with channel formation region, lightly doped drain regions, and the impurity regions 710.

Further, in the p-channel thin film transistor 700c, a channel formation region is formed in a region of the semiconductor film 704c, which overlaps with one of the gate electrodes 706, and the impurity regions 708 which function as a source region and a drain region are formed in regions which do not overlap with one of the gate electrodes 706. Note that the p-channel thin film transistor 700c is not provided with an LDD region here; however, the p-channel thin film transistor may be provided with an LDD region and the n-channel thin film transistor is not necessarily provided with an LDD region.

Next, as shown in FIG. 8A, an insulating film is formed in a single layer or stacked layers so as to cover the semiconductor films 704a to 704c, the gate electrodes 706, and the like; thereby forming electrodes 713, 714, and 715 and a source or drain electrode 712 which is connected to the impurity regions 708 and 710 which form the source regions and the drain regions of the thin film transistors 700a to 700c. The insulating film is formed in a single layer or stacked layers using an inorganic material such as silicon oxide or silicon nitride, an organic material such as polyimide, polyamide, benzocyclobutene, acrylic, or epoxy, a Sloane material, or the like, by a CVD method, a sputtering method, an SOG method, a droplet discharge method, a screen printing method, or the like. Here, the insulating film has a two-layer structure, a silicon nitride oxide film is formed as a first insulating film 711a, and a silicon ox nitride film is formed as a second insulating film 711b. In addition, the source or drain electrode 712 and the electrodes 713, 714, and 715 can be formed of the same material at the same time.

Note that before the insulating films 711a and 711b are formed or after one or more of thin films of the insulating films 711a and 711b are formed, heat treatment for recovering the crystalline of the semiconductor film, for activating the impurity element which has been added into the semiconductor film, or for hydrogenating the semiconductor film may be performed. For the heat treatment, thermal annealing, a laser annealing method, an RTA method, or the like may be adopted.

The source or drain electrode 712, and the electrodes 713, 714, and 715 are formed in a single layer or stacked layers using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or a compound material containing the above-described element as its main component by a CVD method, a sputtering method, or the like. An alloy material containing aluminum as its main component corresponds to a material which contains aluminum as its main component and which also contains nickel, an alloy material which contains aluminum as its main component and which also contains nickel and one or both of carbon and silicon, or the like, for example. Note that the source or drain electrode 712 and the electrodes 713, 714, and 715 desirably use a material which reacts with a photoelectric conversion layer (typically, amorphous silicon) to be formed later and which is hard to be an alloy.

In addition, as shown in FIG. 8A, each end portion of the source or drain electrode 712, and the electrodes 713, 714, and 715 preferably has a tapered shape. Note that the source or drain electrode 712 and the electrodes 713, 714, and 715 are formed so that each taper angle has less than or equal to 80 degrees, desirably, less than or equal to 45 degrees, by an etching method, for example. Accordingly, the photoelectric conversion layer to be formed later can have favorable coverage, and thus, reliability can be improved. Note that the taper angle herein means the angle of inclination between a side surface of the electrode and a bottom surface thereof.

Next, a p-type semiconductor layer 716p is formed in contact with a part of the electrode 713, and a p-type semiconductor layer 717p is formed over the electrode 714, as shown in FIG. 8B. In this embodiment mode, for example, p-type amorphous semiconductor films are formed as the p-type semiconductor layers 716p and 717p. As the p-type amorphous semiconductor films, a semiamorphous silicon film containing an impurity element belonging to Group 13 of the periodic table, for example boron (B), may be formed by a plasma CVD method, or a semiamorphous silicon film may be formed, and then, an impurity element belonging to Group 13 of the periodic table may be introduced.

Note that a semiamorphous semiconductor film including a semiamorphous silicon film is a film which includes a semiconductor having an intermediate structure between an amorphous semiconductor and a semiconductor having a crystalline structure (including a single crystal and a polycrystalline). The semiamorphous semiconductor film is a semiconductor film having a third state which is stable in terms of free energy, and is a crystalline substance having short-range order and lattice distortion. A crystal grain can be dispersed in a non-single crystal semiconductor film by setting a grain size thereof to be 0.5 to 20 nm. The peak of the Raman spectrum of a semiamorphous semiconductor film is shifted to be lower than the wave number of 520 cm$^{-1}$, and the diffraction peaks of (111) and (220) that are thought to be caused by a Si crystal lattice are observed by X-ray diffraction. In addition, the semiamorphous semiconductor film contains hydrogen or a halogen of at least 1 atomic % or more to terminate a dangling bond. In this specification, such a semiconductor film is referred to as a semiamorphous semiconductor (SAS) film for the sake of convenience. Moreover, a noble gas element such as helium, argon, krypton, or neon is contained therein to further promote lattice distortion, so that stability is enhanced and a favorable semiamorphous semiconductor film can be obtained. Note that a microcrystalline semiconductor film is also included in the semiamorphous semiconductor film.

In addition, the SAS film can be obtained by glow discharge decomposition of a gas containing silicon. For a typical gas containing silicon, $SiH_4$ is given, and in addition, $Si_2H_6$, $SiH_2Cl_2$, $SiHCl_3$, $SiCl_4$, $SiF_4$, or the like can be used. The gas containing silicon is diluted with hydrogen or with a gas in which one or more of the noble gas elements of helium, argon, krypton, and neon are added to hydrogen; therefore, the SAS film can be easily formed. It is preferable that the gas containing silicon be diluted at a dilution ratio to be in the range of 2 to 1000 times. Further, a carbide gas such as $CH_4$ or $C_2H_6$; a germanium gas such as $GeH_4$ or $GeF_4$; $F_2$; or the like may be mixed into the gas containing silicon so as to adjust the energy bandwidth to be from 1.5 to 2.4 eV or 0.9 to 1.1 eV.

After the p-type semiconductor layers 716p and 717p are formed, further semiconductor layers (referred to as an intrinsic semiconductor layer or an i-type semiconductor layer) 716i and 717i without containing an impurity imparting a conductivity type and n-type semiconductor layers 716n and 717n are sequentially formed.

Note that, in this specification, an i-type semiconductor layer refers to a semiconductor layer that contains impurities imparting p-type conductivity or n-type conductivity at a concentration of less than or equal to $1 \times 10^{20}$ cm$^{-3}$ and oxygen and nitrogen at a concentration of less than or equal to $5 \times 10^{19}$ cm$^{-3}$. Note that the photoconductivity is preferably greater than the dark conductivity by 1000 times or more. In addition, 10 to 1000 ppm of boron (B) may be added into the i-type semiconductor layers.

As the i-type semiconductor layers 716i and 717i, for example, a semiamorphous silicon film may be formed by a plasma CVD method. As the n-type semiconductor layers 716n and 717n, a semiamorphous silicon film containing an impurity element belonging to Group 15 of the periodic table, for example, phosphorus (P), may be formed, or an impurity element belonging to Group 15 of the periodic table may be introduced after the semiamorphous silicon film is formed.

As set forth above, a first photodiode 716 having a photoelectric conversion layer in which the p-type semiconductor layer 716p, the i-type semiconductor layer 716i, and the n-type semiconductor layer 716n are stacked can be formed, and a second photodiode 717 having a photoelectric conversion layer in which the p-type semiconductor layer 717p, the i-type semiconductor layer 717i, and the n-type semiconductor layer 717n are stacked can be formed.

In addition, as the p-type semiconductor layers 716p and 717p, the i-type semiconductor layers 716i and 717i, and the n-type semiconductor layers 716n and 717n, not only the semiamorphous semiconductor film but also an amorphous semiconductor film may be used.

Next, as shown in FIG. 8C, an insulating film 718 is formed to cover the entire surface. Note that, although the insulating film 718 can be formed by selecting a material and a manufacturing method similar to those of the insulating films 711a and 711b as appropriate, an epoxy resin is formed by using a screen printing method here.

Then, as shown in FIG. 9A, an electrode 719 connected to the source or drain electrode 712 of the n-channel thin film transistor 700a is formed over the insulating film 718. In a similar manner, over the insulating film 718, an electrode 720 is formed to be connected to the uppermost photoelectric conversion layer (here, the n-type semiconductor layer 716n) included in the first photodiode 716. In addition, an electrode 721 which has an area larger than the photoelectric conversion layer is formed over the uppermost photoelectric conversion layer (here, the n-type semiconductor layer 717n) included in the second photodiode 717. In this manner, the photoelectric conversion layer included in the second photodiode 717 is shield from light using the electrode 714 and the electrode 721. Note that the electrodes 719, 720, and 721 can be formed of the same material at the same time. Although these electrodes can be formed by selecting a material and a manufacturing method similar to those of the electrodes 713 and 714, and the like as appropriate, selection is preferably performed in consideration of wet ability to solder to be provided in the subsequent step, intensity in mounting, or the like. For example, the electrodes 719, 720, and 721 may be formed of titanium (Ti) by using a sputtering method or a photolithography method.

Next, an insulating film 722 is formed over the insulating film 718, the electrodes 719, 720 and 721 as a sealing resin by a screen printing method or the like. The insulating film 722 can be formed by selecting a material and a manufacturing method similar to those of the insulating films 711a and 711b, as appropriate. However, the insulating film 722 is not formed over a part of an electrode used for an external input or an external output, and a case where an exposed region is formed in a part of the electrode 719 is shown here. Note that, in a cross section different from FIG. 9A, exposed regions are formed in parts of the electrode 720 connected to the n-type semiconductor layer 716n in the first photodiode 716 and the electrode 721 connected to the p-type semiconductor layer 717p in the second photodiode 717.

Then, as shown in FIG. 9B, an electrode 723 connected to the electrode 719 is formed over the insulating film 722 by a screen printing method or the like. The electrode 723 is a solder electrode, which has a function as an external input electrode or an external output electrode. In addition, as the electrode 723, a bump formed of metal (gold, silver, or the like), a bump formed using a conductive resin, or the like can be used as well as solder. Further, lead-free solder may be used in consideration of environmental problems.

As set forth above, the semiconductor device of the present invention can be formed. By forming a photodiode and a circuit group which is formed using transistors over the same substrate, it is possible to reduce the cost, the volume of parts due to reduction in thickness, and the area for mounting. In addition, noise superposition can be reduced.

In addition, by forming the first photodiode 716 and the second photodiode 717 in the same step, characteristics of these photodiodes can be almost equal to each other, and reliability of the semiconductor device of the present invention can be improved.

Note that, in the first photodiode 716 and the second photodiode 717, the stacking order of the p-type semiconductor layer, the i-type semiconductor layer, and the n-type semiconductor layer is not limited to the above stacking order, and the n-type semiconductor layer, the i-type semiconductor layer, and the p-type semiconductor layer may be sequentially stacked.

Figure 10:
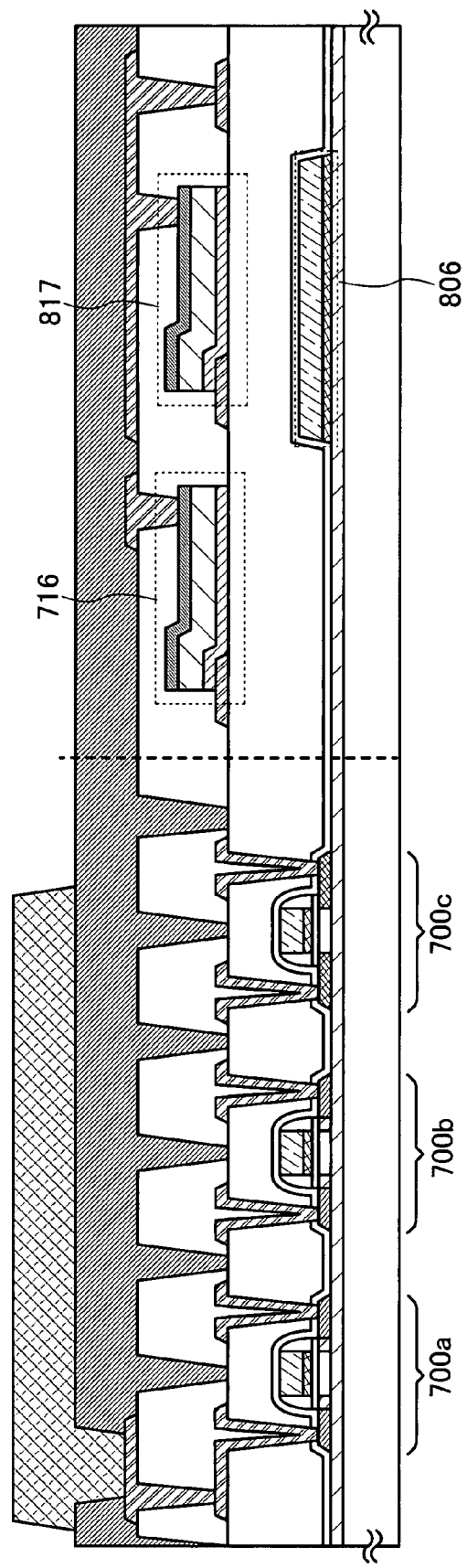
FIG. 10 is a fragmentary sectional view of a semiconductor device of the present invention.

The semiconductor device of the present invention is not limited to the above structure; for example, a second photodiode 817 may have a structure similar to that of the first photodiode 716, as shown in FIG. 10. Note that with such a structure, destruction of the photodiode due to static electricity can be suppressed, which is more preferable. However, the second photodiode 817 is necessary to be shielded from light, and incidence of light on the second photodiode 817 is blocked here by using a light shielding film 806. This light shielding film 806 can be formed of the same material as that of the gate electrodes 706 of the thin film transistors 700a to 700c at the same time. In this manner, the first photodiode 716 and the second photodiode 817 can have similar structures. Further, an electrode connected to a photoelectric conversion layer in which a p-type semiconductor layer, an i-type semiconductor layer, and an n-type semiconductor film are stacked is not necessarily used for shielding the second photodiode from light.

Figure 11:
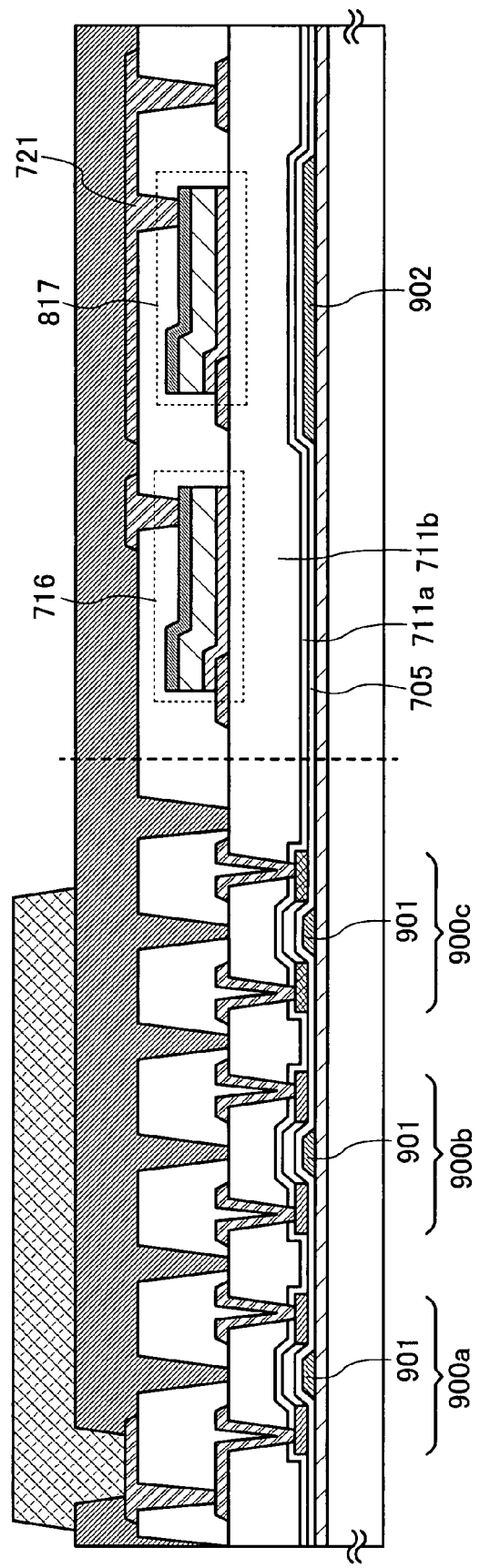
FIG. 11 is a fragmentary sectional view of a semiconductor device of the present invention.

In addition, as the thin film transistors 700a to 700c, not only a top gate type thin film transistor, but also a bottom gate type thin film transistor having gate electrodes 901 below a semiconductor layer may be used as shown in FIG. 11. Note that an impurity region which shows n-type conductivity or p-type conductivity and a channel formation region are formed in the semiconductor layer. In addition, the second photodiode 817 is shielded from light using the electrode 721 and a light shielding film 902. This light shielding film 902 can be formed of the same material as that of the gate electrodes 901 of the thin film transistors 900a to 900c at the same time.

Although the first photodiode and the second photodiode are PIN photodiodes in this embodiment mode, the present invention is not particularly limited to this.

As set forth above, the semiconductor device of the present invention is not limited to the above structure, and various structures can be used as long as the second photodiode can be shielded from light.

Note that this embodiment mode can be combined with other embodiment modes, as appropriate.

Embodiment Mode 3

This embodiment mode will describe examples where the semiconductor device obtained by the present invention is incorporated in various electronic devices as an optical sensor As electronic devices to which the present invention is applied, computers, displays, cellular phones, televisions, and the like are given. Specific examples of such electronic devices are described with reference to FIGS. 12 to 15. Note that the electronic devices to which the semiconductor device of the present invention is applied are not limited to these specific examples.

Figure 12:
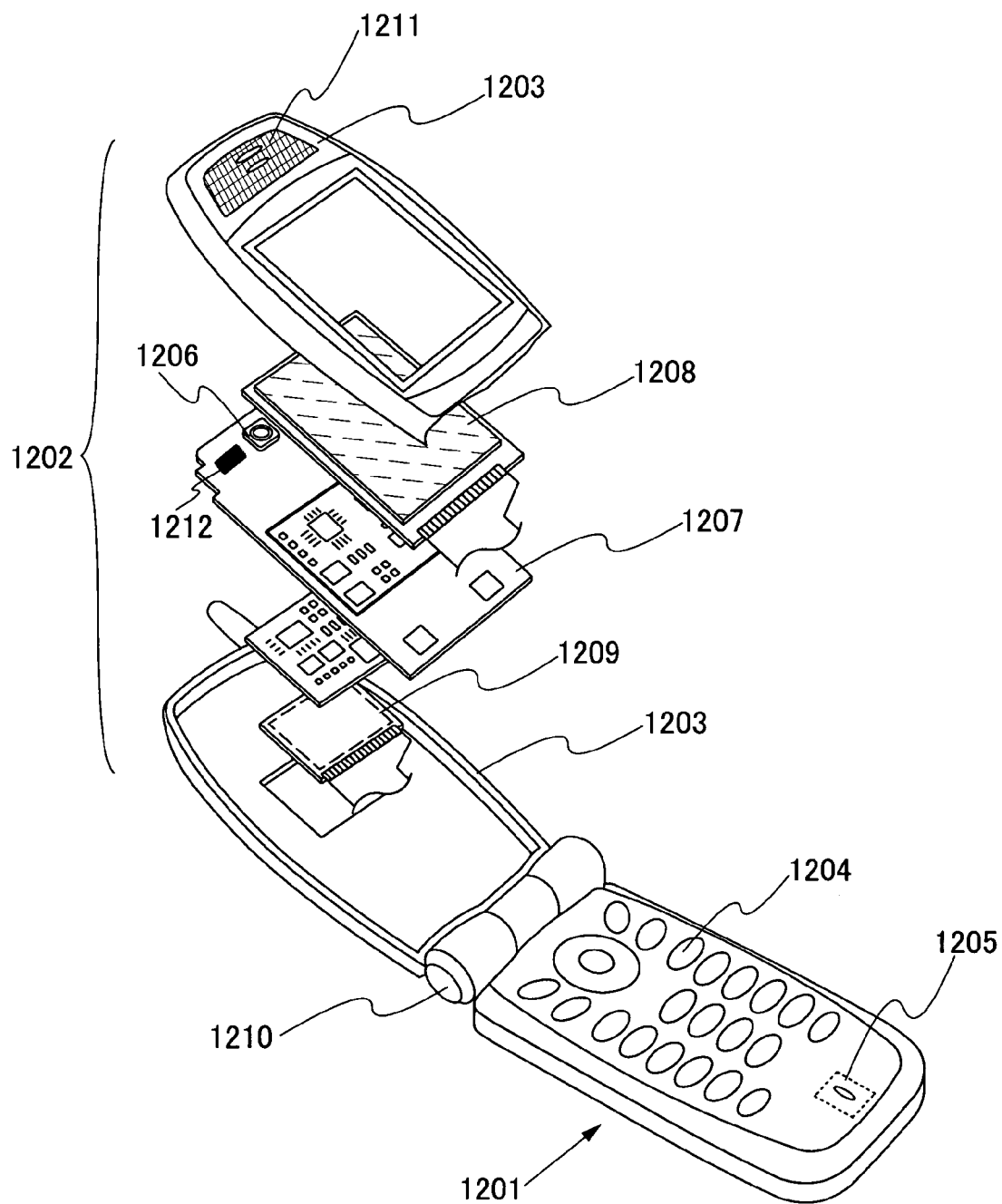
FIG. 12 is a diagram showing a device mounting a semiconductor device of the present invention.

FIG. 12 shows an example in which the present is applied to a cellular phone which includes a main body (A) 1201, a main body (B) 1202, a chassis 1203, operation keys 1204, an audio output portion 1205, an audio input portion 1206, a circuit board 1207, a display panel (A) 1208, a display panel (B) 1209, a hinge 1210, a light-transmitting material portion 1211, and an optical sensor 1212. The present invention can be applied to the optical sensor 1212.

The optical sensor 1212 detects light which has passed through the light-transmitting material portion 1211, controls the brightness of the display panel (A) 1208 and the display panel (B) 1209 in accordance with the illuminance of the detected external light, and controls the illumination of the operation keys 1204 based on the illuminance obtained by the optical sensor 1212. In such a manner, power consumption of the cellular phone can be reduced. Since the semiconductor device of the present invention can be operated at a low power supply voltage, the power consumption can be reduced further.

Figure 13A:
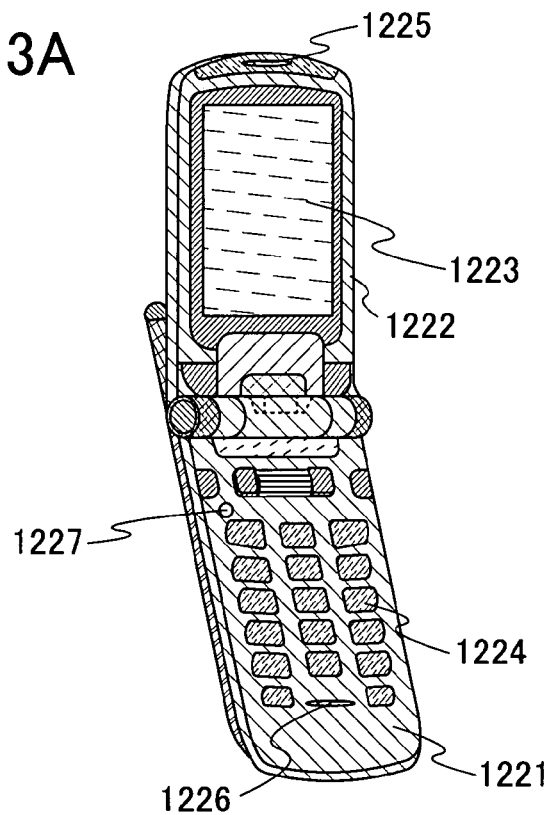
FIGS. 13A and 13B are diagrams showing devices mounting a semiconductor device of the present invention.
Figure 13B:
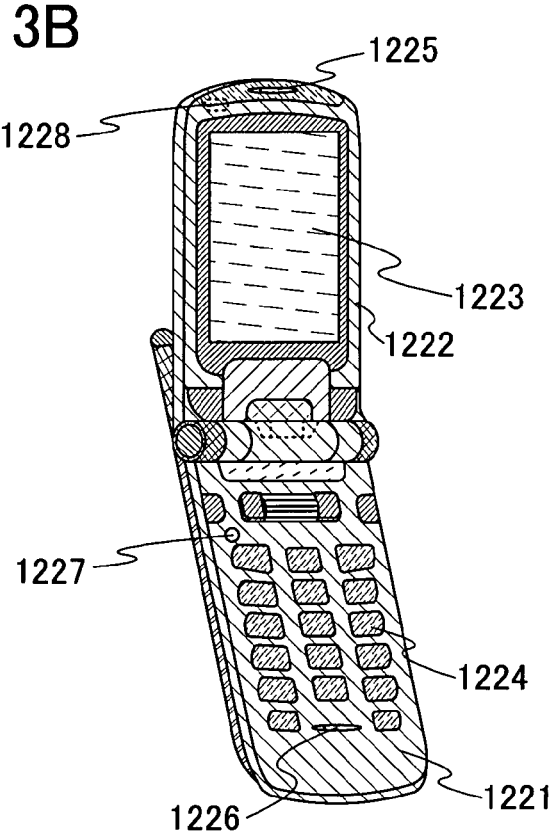

FIGS. 13A and 13B show examples of a cellular phone which is different from the above example. In FIGS. 13A and 13B, reference numeral 1221 denotes a main body, 1222 denotes a chassis, 1223 denotes a display panel, 1224 denotes operation keys, 1225 denotes an audio output portion, 1226 denotes an audio input portion, and 1227 and 1228 denote optical sensors to which the present invention is applied.

In the cellular phone shown in FIG. 13A, the brightness of the display panel 1223 and the operation keys 1224 can be controlled by detecting external light with the use of the optical sensor 1227 provided in the main body 1221.

In addition, in the cellular phone shown in FIG. 13B, the optical sensor 1228 is provided inside the main body 1221, in addition to the structure of FIG. 13A. The brightness of a backlight that is provided in the display panel 1223 can also be detected by the optical sensor 1228 and the brightness can be controlled.

With these optical sensors 1227 and 1228, power consumption of the cellular phone can be reduced. Further, the semiconductor device of the present invention can be operated at a low power supply voltage; therefore, power consumption can be reduced further.

Figure 14A:
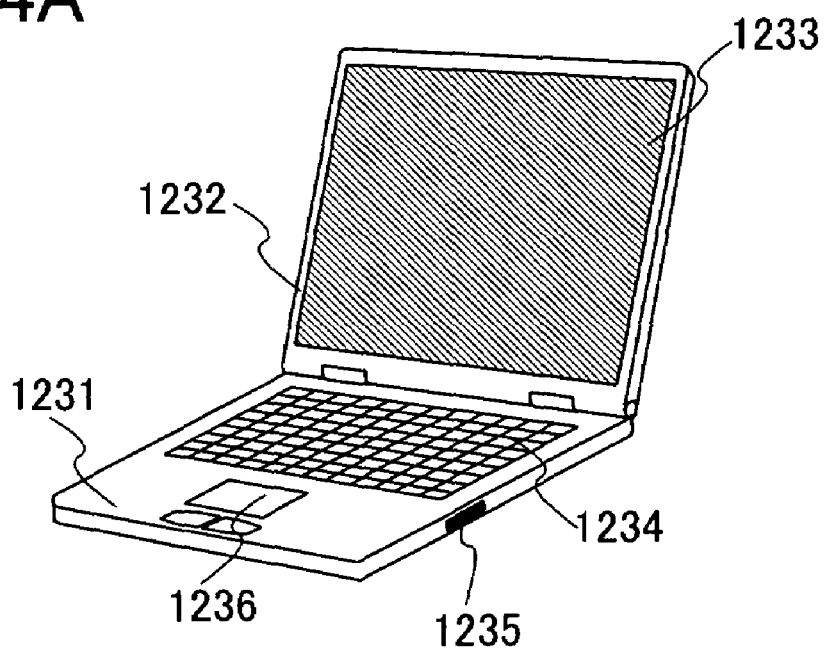
FIGS. 14A and 14B are diagrams showing devices mounting a semiconductor device of the present invention.
Figure 14B:
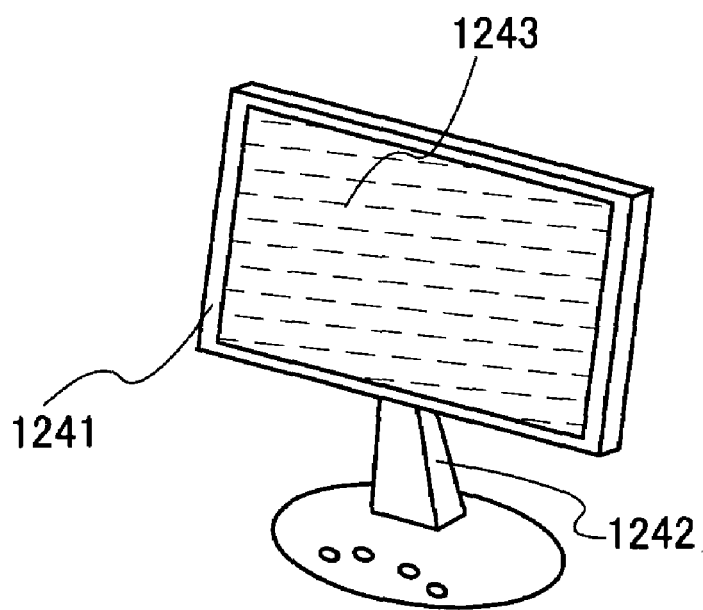

FIG. 14A shows a computer which includes a main body 1231, a chassis 1232, a display portion 1233, a keyboard 1234, an external connection port 1235, a pointing device 1236, and the like. In addition, FIG. 14B shows a display device such as a television receiver. The display device includes a chassis 1241, a support base 1242, a display portion 1243, and the like.

Figure 15:
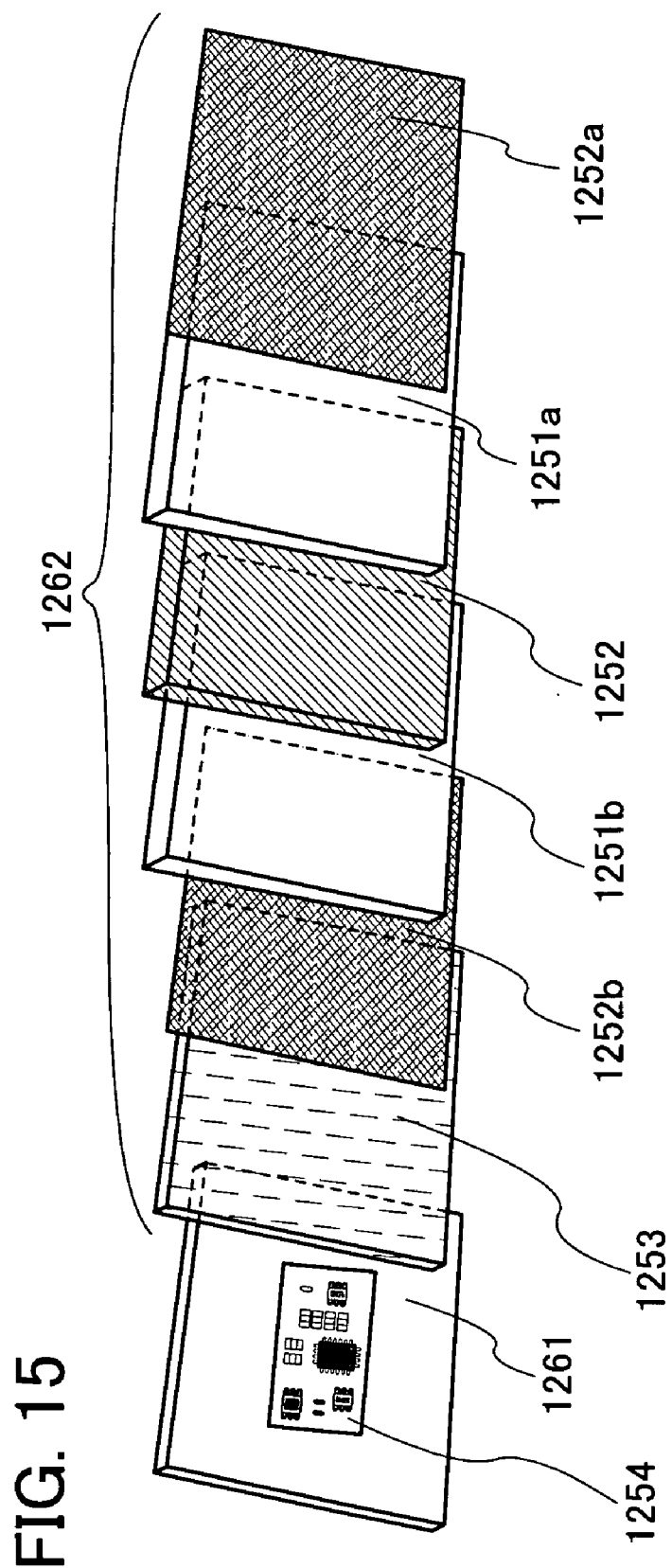
FIG. 15 is a diagram showing a device mounting a semiconductor device of the present invention.

FIG. 15 shows a detailed structure of cases where liquid crystal panels are used for the display portion 1233 of the computer shown in FIG. 14A and the display portion 1243 of the display device shown in FIG. 14B. A liquid crystal panel 1262 shown in FIG. 15 is incorporated in a chassis 1261 and includes substrates 1251a and 1251b, a liquid crystal layer 1252 interposed between the substrates 1251a and 1251b, polarizing filters 1252a and 1252b, a backlight 1253, and the like. Note that an optical sensor portion 1254 is formed in the chassis 1261.

The optical sensor portion 1254, which is manufactured using the present invention, detects each amount of light from the backlight 1253, and the information is fed back to adjust the brightness of the liquid crystal panel 1262. Therefore, power consumption of the computer and display device can be reduced. Furthermore, the semiconductor device of the present invention can be operated at a low power supply voltage; therefore, power consumption can be reduced further.

Figure 16A:
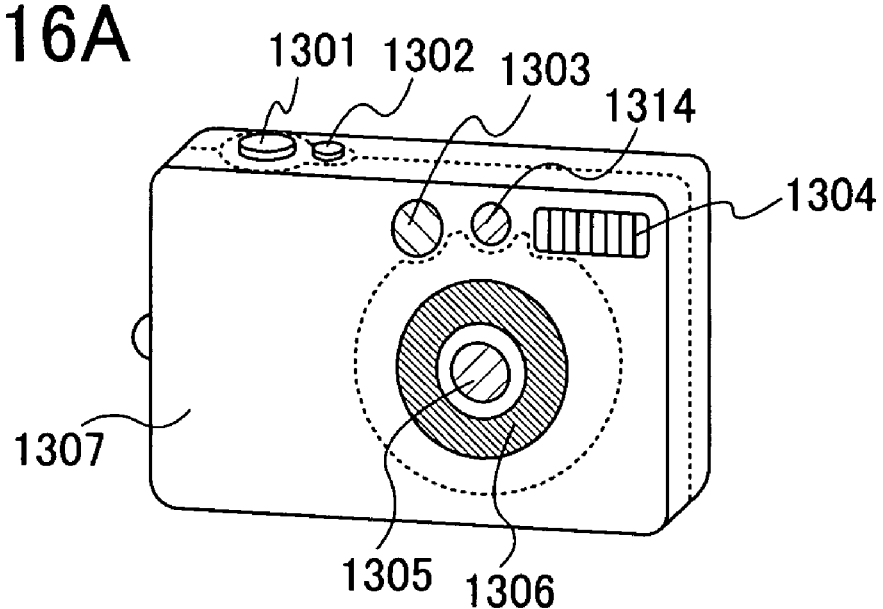
FIGS. 16A and 16B are diagrams showing a device mounting a semiconductor device of the present invention.
Figure 16B:
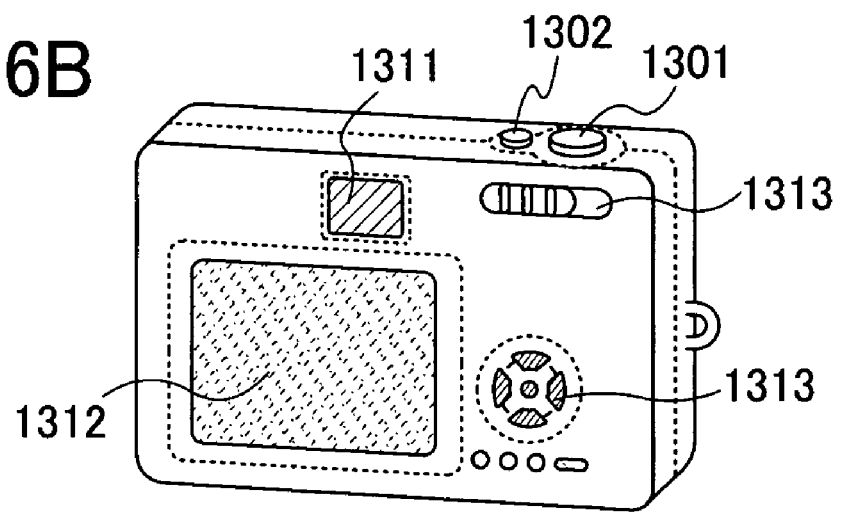

FIGS. 16A and 16B are views each showing an example in which the optical sensor of the present invention is incorporated into a camera such as a digital camera. FIG. 16A is a perspective view seen from the front side of the digital camera. FIG. 16B is a perspective view seen from the backside. In FIG. 16A, the digital camera is provided with a release button 1301, a main switch 1302, a viewfinder 1303, a flash portion 1304, a lens 1305, a barrel 1306, a chassis 1307, and an optical sensor 1314. In FIG. 16B, an eyepiece finder 1311, a monitor 1312, and operation buttons 1313 are provided.

When the release button 1301 is pushed down to the half point, a focus adjustment mechanism and an exposure adjustment mechanism are operated, and when the release button is pushed down to the lowest point, a shutter is opened. By the main switch 1302 being pushed down or rotated, a power supply of the digital camera is switched on or off. The viewfinder 1303 is located above the lens 1305, which is on the front side of the digital camera, for checking a shooting range and the focus point from the eyepiece finder 1311 shown in FIG. 16B. The flash portion 1304 is located in the upper position on the front side of the digital camera. When the subject brightness is not enough, auxiliary light is emitted from the flash portion 1304, at the same time as pushing down the release button 1301 to open a shutter. The lens 1305 is located at the front side of the digital camera and made of a focusing lens, a zoom lens, and the like. The lens 1305 forms a photographic optical system with a shutter and a diaphragm that are not shown. In addition, behind the lens, an imaging device such as a CCD (Charge Coupled Device) is provided. The barrel 1306 moves a lens position to adjust the focus of the focusing lens, the zoom lens, and the like. In shooting, the barrel 1306 is slid out to move the lens 1305 forward. Further, when carrying the digital camera, the lens 1305 is moved backward to be compact. Note that a structure is used in this embodiment mode, in which the subject can be photographed by zoom by sliding out the barrel; however, the present invention is not limited to this structure, and a structure may also be used for the digital camera, in which shooting can be performed by zoom with the use of a structure of a photographic optical system inside the chassis 1307, without sliding out the barrel. The eyepiece finder 1311 is located in the upper position on the backside of the digital camera for looking there through in checking a shooting range and the focus point. The operation buttons 1313 are each a button for various functions provided on the backside of the digital camera, which includes a set up button, a menu button, a display button, a functional button, a select button, and the like.

When the optical sensor to which the present invention is applied is incorporated in the camera shown in FIGS. 16A and 16B, the optical sensor can detect whether light exists or not and light intensity. Accordingly, exposure adjustment or the like of a camera can be performed accurately.

In addition, the optical sensor of the present invention can also be applied to other electronic devices such as a projection TV and a navigation system, for example. That is, the optical sensor of the present invention can be used for any device as long as it needs to detect light. When a result of detecting light is fed back to a lighting control device or the like included in an electronic device, power consumption can be reduced.

Note that this embodiment mode can be combined with other embodiment modes and embodiments, as appropriate.

This application is based on Japanese Patent Application serial No. 2006-150244 filed in Japan Patent Office on May 30, 2006, the entire contents of which are hereby incorporated by reference.

What is claimed is:

1. A semiconductor device comprising:
a first photodiode which detects light;
a second photodiode;
a light shielding film for shielding the second photodiode from light;
a first circuit group including a voltage follower circuit to which an output from one terminal of the first photodiode is inputted;
a second circuit group including a voltage regulator circuit for adjusting an output obtained from one terminal of the second photodiode to a voltage based on a voltage under a predetermined temperature; and
a compensation circuit to which outputs from the first circuit group and the second circuit group are inputted, the compensation circuit adding or subtracting each of the outputs,
wherein a reference potential is supplied to the other terminal of the first photodiode; and
wherein a potential is supplied to the other terminal of the second photodiode so that a forward bias is applied to the second photodiode.

2. The semiconductor device according to claim 1,
wherein each of the first photodiode and the second photodiode comprises an n-type semiconductor layer and a p-type semiconductor layer;
wherein one terminal of the first photodiode and the other terminal of the second photodiode are electrically connected to the p-type semiconductor layer; and
wherein the other terminal of the first photodiode and one terminal of the second photodiode are electrically connected to the n-type semiconductor layer.

3. The semiconductor device according to claim 1,
wherein one terminal of the first photodiode has a higher potential than the other terminal thereof when light is delivered.

4. The semiconductor device according to claim 1,
wherein the second circuit group comprises a function of amplifying or inverting an output obtained from one terminal of the second photodiode.

5. The semiconductor device according to claim 1,
wherein each of the first circuit group and the second circuit group comprises an operational amplifier.

6. The semiconductor device according to claim 1,
wherein each of the first circuit group and the second circuit group comprises a plurality of thin film transistors.

7. An electronic device comprising the semiconductor device according to claim 1.

8. A semiconductor device comprising:
a first photodiode which detects light;
a second photodiode;
a light shielding film for shielding the second photodiode from light;
a first circuit group including a voltage follower circuit to which an output from one terminal of the first photodiode is inputted;
a second circuit group to which an output obtained from one terminal of the second photodiode is inputted, the second circuit group including an inverting amplifier circuit, an inverter circuit, and a voltage regulator circuit for adjusting an output from the first circuit group to a voltage based on a voltage under a predetermined temperature; and
a compensation circuit to which outputs from the first circuit group and the second circuit group are inputted, the compensation circuit adding or subtracting each of the outputs,
wherein a reference potential is supplied to the other terminal of the first photodiode;
wherein a potential is supplied to the other terminal of the second photodiode so that a forward bias is applied to the second photodiode; and
wherein one terminal of the first photodiode has a higher potential than the other terminal thereof when light is delivered.

9. The semiconductor device according to claim 8,
wherein each of the first photodiode and the second photodiode comprises a p-type semiconductor layer, an n-type semiconductor layer, and an i-type semiconductor layer provided between the p-type semiconductor layer and the n-type semiconductor layer.

10. The semiconductor device according to claim 8,
wherein each of the first circuit group and the second circuit group comprises an operational amplifier.

11. The semiconductor device according to claim 8,
wherein each of the first circuit group and the second circuit group comprises a plurality of thin film transistors.

12. An electronic device comprising the semiconductor device according to claim 8.

13. A semiconductor device comprising:
a first photodiode which detects light;
a second photodiode;
a light shielding film for shielding the second photodiode;
a first circuit group including a voltage follower circuit to which an output from one terminal of the first photodiode is inputted;
a second circuit group including: an inverting amplifier circuit to which an output obtained from one terminal of the second photodiode is inputted, an inverter circuit, and a voltage regulator circuit for adjusting an output from the first circuit group to a voltage based on a voltage under a predetermined temperature; and
an adding circuit to which an output from the first circuit group and an output from the second circuit group are inputted,
wherein a reference potential is supplied to the other terminal of the first photodiode;

wherein a potential is supplied to the other terminal of the second photodiode so that a forward bias is applied to the second photodiode; and wherein one terminal of the first photodiode has a higher potential than the other terminal when light is delivered.

14. The semiconductor device according to claim 13, wherein each of the first photodiode and the second photodiode comprises a p-type semiconductor layer, an n-type semiconductor layer, and an i-type semiconductor layer provided between the p-type semiconductor layer and the n-type semiconductor layer.

15. The semiconductor device according to claim 13, wherein each of the first circuit group and the second circuit group comprises an operational amplifier.

16. The semiconductor device according to claims 13, wherein each of the first circuit group and the second circuit group comprises a plurality of thin film transistors.

17. An electronic device comprising the semiconductor device according to claim 13.

18. A semiconductor device comprising:

a first photodiode to detect light, the first photodiode including a first terminal and a second terminal;

a second photodiode including a first terminal and a second terminal;

a light shielding film for shielding the second photodiode from light;

a first circuit group including a voltage follower circuit and connected to the first terminal of the first photodiode, wherein an output from the first terminal is inputted to the first terminal of the first photodiode;

a second circuit group including a voltage regulator circuit and connected to the first terminal of the second photodiode, wherein an output from the first terminal of the second photodiode is adjusted to a voltage which uses a voltage under a predetermined temperature as a reference; and a compensation circuit connected to the first and second circuit groups, wherein the fluctuation of the output from the first terminal of the first photodiode is compensated.

19. The semiconductor device according to claim 18, wherein a reference potential is supplied to the second terminal of the first photodiode; and wherein a potential is supplied to the second terminal of the second photodiode so that a forward bias is applied to the second photodiode.

20. The semiconductor device according to claim 18, wherein each of the first photodiode and the second photodiode comprises a p-type semiconductor layer, an n-type semiconductor layer, and an i-type semiconductor layer provided between the p-type semiconductor layer and the n-type semiconductor layer.

21. The semiconductor device according to claim 18, wherein each of the first circuit group and the second circuit group comprises an operational amplifier.

22. The semiconductor device according to claims 18, wherein each of the first circuit group and the second circuit group comprises a plurality of thin film transistors.

23. An electronic device comprising the semiconductor device according to claim 18.

* * * * *